(12) United States Patent
Chi et al.

(10) Patent No.: US 10,090,410 B1
(45) Date of Patent: Oct. 2, 2018

(54) FORMING A COMBINATION OF LONG CHANNEL DEVICES AND VERTICAL TRANSPORT FIN FIELD EFFECT TRANSISTORS ON THE SAME SUBSTRATE

(71) Applicant: INTERNATIONAL BUSINESS MACHINES CORPORATION, Armonk, NY (US)

(72) Inventors: Cheng Chi, Jersey City, NJ (US); Tenko Yamashita, Schenectady, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/462,175

(22) Filed: Mar. 17, 2017

(51) Int. Cl.
| H01L 27/088 | (2006.01) |
| H01L 29/78 | (2006.01) |
| H01L 21/8234 | (2006.01) |
| H01L 29/161 | (2006.01) |
| H01L 29/10 | (2006.01) |
| H01L 29/08 | (2006.01) |
| H01L 29/423 | (2006.01) |
| H01L 29/66 | (2006.01) |

(52) U.S. Cl.
CPC .. *H01L 29/7827* (2013.01); *H01L 21/823431* (2013.01); *H01L 21/823487* (2013.01); *H01L 27/0886* (2013.01); *H01L 29/0847* (2013.01); *H01L 29/1033* (2013.01); *H01L 29/161* (2013.01); *H01L 29/42384* (2013.01); *H01L 29/66666* (2013.01); *H01L 29/66795* (2013.01); *H01L 29/7856* (2013.01)

(58) Field of Classification Search
CPC ..... H01L 21/823431; H01L 21/823412; H01L 21/823487; H01L 27/0886; H01L 27/11273; H01L 29/66666
See application file for complete search history.

(56) References Cited

U.S. PATENT DOCUMENTS

| 6,638,823 | B2 | 10/2003 | Cho et al. |
| 6,787,402 | B1 | 9/2004 | Yu |
| 7,250,658 | B2 | 7/2007 | Doris et al. |
| 7,446,025 | B2 | 11/2008 | Cohen et al. |
| 2007/0080387 | A1* | 4/2007 | Liu ........................ H01L 28/82 257/303 |
| 2016/0126352 | A1 | 5/2016 | Cheng et al. |
| 2017/0352742 | A1* | 12/2017 | Cheng ............... H01L 29/66666 |
| 2018/0005895 | A1* | 1/2018 | Cheng ............. H01L 21/823456 |

* cited by examiner

*Primary Examiner* — Jae Lee
(74) *Attorney, Agent, or Firm* — Tutunjian & Bitetto, P.C.; Vazken Alexanian

(57) ABSTRACT

A method of forming a vertical transport fin field effect transistor and a long-channel field effect transistor on the same substrate, including, forming a recessed region in a substrate and a fin region adjacent to the recessed region, forming one or more vertical fins on the fin region, forming a long-channel pillar from the substrate in the recessed region, where the long-channel pillar is at a different elevation than the one or more vertical fins, forming two or more long-channel source/drain plugs on the long-channel pillar, forming a bottom source/drain plug in the fin region, where the bottom source/drain plug is below the one or more vertical fins, forming a gate structure on the long-channel pillar and a gate structure on the one or more vertical fins, and forming a top source/drain on the top surface of the one or more vertical fins.

14 Claims, 20 Drawing Sheets

FORMING A COMBINATION OF LONG CHANNEL DEVICES AND VERTICAL TRANSPORT FIN FIELD EFFECT TRANSISTORS ON THE SAME SUBSTRATE

BACKGROUND

Technical Field

The present invention generally relates to forming a vertical transport fin field effect transistor (VT FinFET) and a long-channel field effect transistors on the same substrate, and more specifically to forming a combination of VT FinFETs and planar long-channel FETs on adjacent regions of a substrate.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin approximately rectangular Si, commonly referred to as the fin with a gate on the fin, as compared to a metal-oxide-semiconductor field effect transistor (MOSFET) with a gate parallel with the plane of the substrate.

Depending on the doping of the source and drain, an n-type FET (nFET) or a p-type FET (pFET) can be formed. An nFET and a pFET can be coupled to form a complementary metal oxide semiconductor (CMOS) device, where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components, including channel lengths and gate dielectric thicknesses.

SUMMARY

In accordance with an embodiment of the present invention, a method of forming a vertical transport fin field effect transistor and a long-channel field effect transistor on the same substrate is provide. The method includes forming a recessed region in a substrate and a fin region adjacent to the recessed region. The method further includes forming one or more vertical fins on the fin region, where the one or more vertical fins extend away from the substrate, and forming a long-channel pillar from the substrate in the recessed region, where the long-channel pillar is at a different elevation than the one or more vertical fins. The method further includes forming two or more long-channel source/drain plugs on the long-channel pillar, and forming a bottom source/drain plug in the fin region, where the bottom source/drain plug is below the one or more vertical fins. The method further includes forming a gate structure on the long-channel pillar and a gate structure on the one or more vertical fins, and forming a top source/drain on the top surface of the one or more vertical fins, where the top source/drain is in the fin region.

In accordance with another embodiment of the present invention, a method of forming a vertical transport fin field effect transistor and a long-channel field effect transistor on the same substrate is provide. The method includes forming a recessed region in a substrate and a fin region adjacent to the recessed region. The method further includes forming one or more vertical fins on the fin region, where the one or more vertical fins extend away from the substrate. The method further includes forming a long-channel pillar from the substrate in the recessed region, wherein the top surface of the long-channel pillar is below the bottom of the one or more vertical fins, and forming a gate structure on the long-channel pillar, wherein the gate structure on the long-channel pillar has an inverted "T" shape directly above a central section of the long-channel pillar. The method further includes forming a gate structure on the one or more vertical fins.

In accordance with yet another embodiment of the present invention, a vertical transport fin field effect transistor and a long-channel field effect transistor on the same substrate is provided. The vertical transport fin field effect transistor and long-channel field effect transistor includes one or more vertical fins on a fin region of a substrate, where the one or more vertical fins extend away from the substrate, a long-channel pillar on a recessed region of the substrate, where the recessed region is adjacent to the fin region, and the long-channel pillar is at a different elevation than the one or more vertical fins, a bottom source/drain on the fin region below the one or more vertical fins, two or more long-channel source/drains on the long-channel pillar, a gate structure on the long-channel pillar, a gate structure on the one or more vertical fins; and a top source/drain on the top surface of the one or more vertical fins, where the top source/drain is in the fin region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
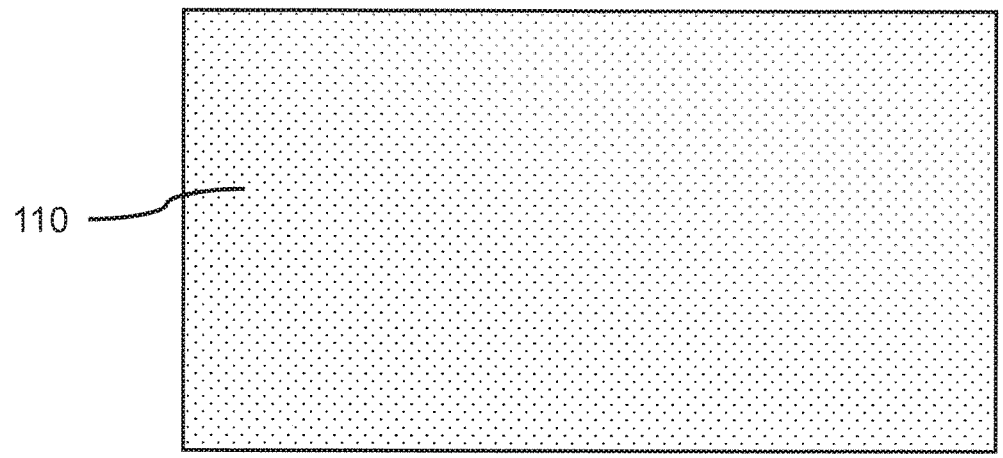
FIG. 1 is a cross-sectional side view showing a substrate, in accordance with an embodiment of the present invention.

Embodiments of the present invention relate generally to forming vertical transport fin field effect transistors (VT FinFETs) on the same substrate with planar long-channel field effect devices, where long-channel FETs can be used for CMOS technology and analog applications. Forming VT FinFETs alone on a substrate restricts the devices and circuits constructed because, due to their intrinsic vertical structure, long-channel and short-channel VT FinFETs cannot presently be processed together on the same substrate.

Embodiments of the present invention also relates generally to integrating a planar long-channel FET with s short-channel VT FinFET on the same substrate, where the planar long-channel FET and short-channel VT FinFET can be adjacent to each other.

Embodiments of the present invention also relates generally to forming planar long-channel FETs with short-channel VT FinFETs on the same substrate using shared processing steps that shorten the fabrication process. The gate structures can be formed on the planar long-channel FETs and short-channel VT FinFETs at the same time using the same processing steps.

Exemplary applications/uses to which the present invention can be applied include, but are not limited to: fabrication of Complementary metal-oxide-semiconductor (CMOS) devices for logic circuits (e.g., NAND, NOR, XOR, etc.), high speed memory (e.g., SRAM), and application specific integrated circuits (ASICs).

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), flowable chemical vapor deposition (FCVD), electron-beam physical vapor deposition (EB-PVD), and plasma-enhanced atomic layer deposition (PEALD). The depositions can be epitaxial processes, and the deposited material can be crystalline. In various embodiments, formation of a layer can be by one or more deposition processes, where, for example, a conformal layer may be formed by a first process (e.g., ALD, PEALD, etc.) and a fill may be formed by a second process (e.g., CVD, electrodeposition, PVD, etc.).

It is to be understood that the present invention will be described in terms of a given illustrative architecture; however, other architectures, structures, substrate materials and process features and steps can be varied within the scope of the present invention.

It should be noted that certain features may not be shown in all figures for the sake of clarity. This is not intended to be interpreted as a limitation of any particular embodiment, or illustration, or scope of the claims.

Reference to source/drain projections, layers, regions, etc., is intended to indicate that the particular device feature can be implemented as a source or a drain except as expressly indicated otherwise. In addition, the role of source and drain for an active device can in some instances be reversed, so a previously indicated drain may instead be a source and vice versa. Reference to a source/drain is, therefore, intended to encompass the broadest reasonable scope of the term.

Referring now to the drawings in which like numerals represent the same or similar elements and initially to FIG. 1, a cross-sectional side view of a substrate is shown, in accordance with an embodiment of the present invention.

In one or more embodiments, a substrate 110 can be a semiconductor or an insulator with an active surface semiconductor layer. The substrate can include a carrier layer that provides mechanical support for other layers of the substrate. The substrate can include crystalline, semi-crystalline, microcrystalline, or amorphous regions. The substrate can be essentially (i.e., except for contaminants) a single element (e.g., silicon), primarily (i.e., with doping) of a single element, for example, silicon (Si) or germanium (Ge), and/or the substrate can include a compound, for example, $Al_2O_3$, $SiO_2$, GaAs, SiC, Si:C, or SiGe. The substrate can also have multiple material layers, for example, a semiconductor-on-insulator substrate (SeOI), such as a silicon-on-insulator substrate (SOI), germanium-on-insulator substrate (GeOI), or silicon-germanium-on-insulator substrate (SGOI). The substrate can also have other layers forming the substrate, including high-k oxides and/or nitrides. Other semiconductor devices and features, such as shallow trench isolation (STI) regions, may already be formed on the substrate.

In one or more embodiments, the substrate 110 can be a silicon wafer. In various embodiments, the substrate can be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

Figure 2:
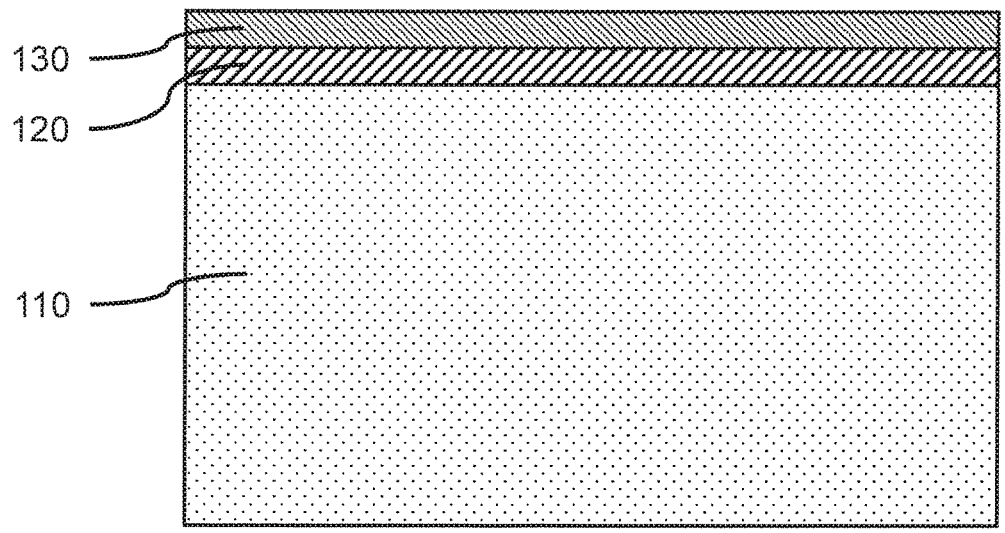
FIG. 2 is a cross-sectional side view showing a template layer at the surface of the substrate and a masking layer on the template layer, in accordance with an embodiment of the present invention.

FIG. 2 is a cross-sectional side view showing a template layer at the surface of the substrate and a masking layer on the template layer, in accordance with an embodiment of the present invention.

In one or more embodiments, a template layer 120 can be formed on the surface of the substrate 110, where the template layer 120 can be blanket deposited on the substrate 110. The template layer 120 can be formed by CVD, PECVD, PVD, as well as combinations thereof. The template layer 120 can be a hardmask that can be patterned to cover and expose different regions of the substrate 110.

In various embodiments, the template layer 120 can be silicon oxide (SiO), silicon nitride (SiN), silicon oxynitride (SiON), silicon carbonitride (SiCN), silicon boronitride (SiBN), silicon carbide (SiC), silicon borocarbide (SiBC), silicon boro carbonitride (SiBCN), boron carbide (BC), boron nitride (BN), or combinations thereof, where the template layer 120 may include one or more layers.

In one or more embodiments, the template layer 120 can be formed to a thickness in the range of about 10 nm to about 100 nm, or in the range of about 30 nm to about 70 nm, although other thicknesses are also contemplated.

In one or more embodiments, a masking layer 130 can be formed on the template layer 120. The masking layer 130 can be a softmask, for example, an organic lithography layer, or an extreme ultra violet lithography (EUVL) material, that can be patterned and developed to expose a portion of the underlying template layer 120. In one or more embodiments, the masking layer 130 can be a positive or negative resist material, for example, Poly(methyl methacrylate) (PMMA) or SU-8, or an electron-beam (e-beam) cured material, for example, hydrogen silsesquioxane (HSQ) that can be suitably patterned. In various embodiments, the masking layer 130 can be spun on, deposited by CVD or low pressure CVD (LPCVD).

Figure 3:
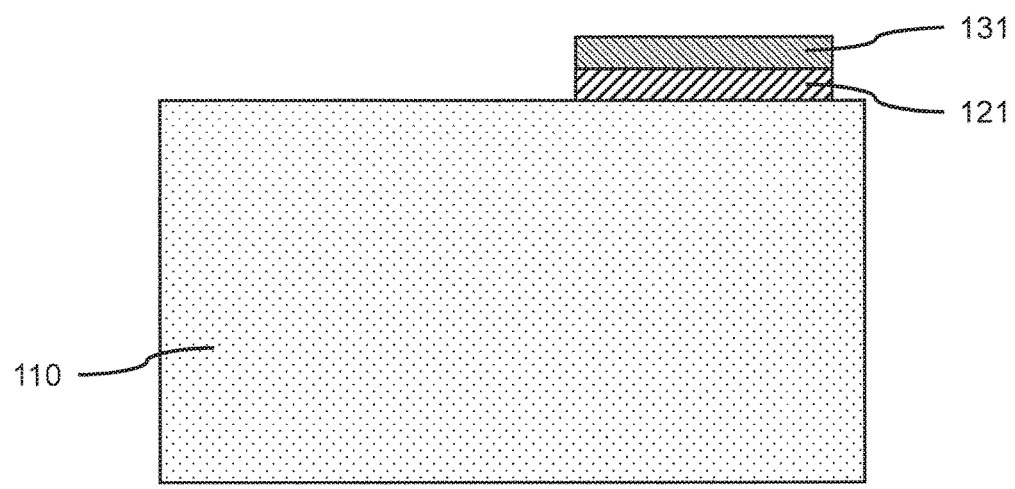
FIG. 3 is a cross-sectional side view showing a patterned masking layer and template layer on a portion of the surface of the substrate, in accordance with an embodiment of the present invention.

FIG. 3 is a cross-sectional side view showing a patterned masking layer and template layer on a portion of the surface of the substrate, in accordance with an embodiment of the present invention.

In one or more embodiments, the masking layer 130 can be patterned and developed to expose portions of the underlying template layer 120, where the masking layer can be patterned to expose the template layer 120 over a portion of the substrate predetermined to have long-channel devices formed thereon.

In one or more embodiments, the exposed portions of the template layer 120 can be removed to expose underlying portions of the substrate 110, where the substrate material can be removed, for example, by a directional etch (e.g., a reactive ion etch (RIE)).

Figure 4:
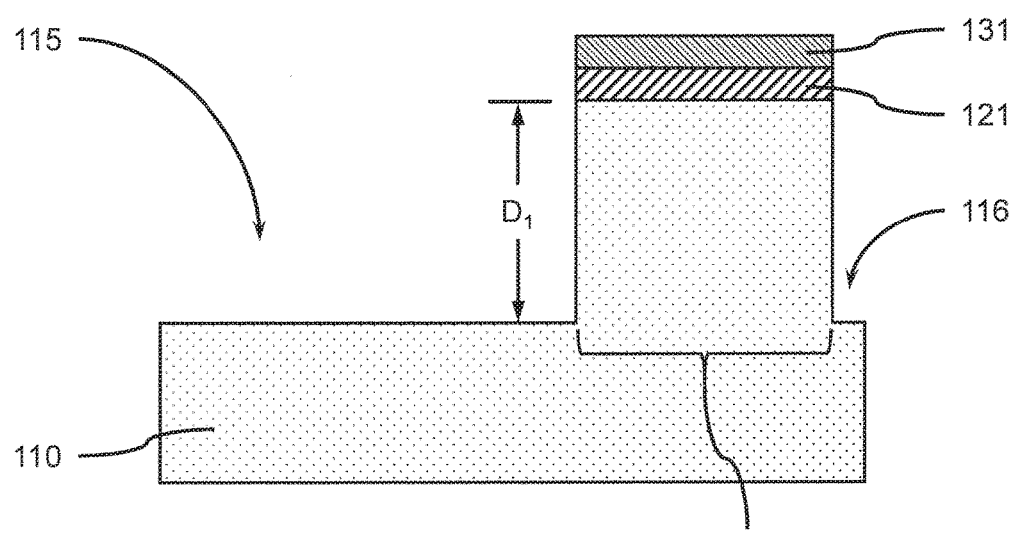
FIG. 4 is a cross-sectional side view showing a recessed region and a delineating trench setting off a fin region on the substrate, in accordance with an embodiment of the present invention.

FIG. 4 is a cross-sectional side view showing a recessed region and a delineating trench setting off a fin region on the substrate, in accordance with an embodiment of the present invention.

In one or more embodiments, a recessed region 115 can be formed in the substrate 110, whereas a fin region 111 can remain. The recessed region 115 and fin region 111 can be formed by removing predetermined portions of the substrate material on one or more sides of the fin region 111. A delineating trench 116 can be formed on one or more sides of the fin region 111 that do not have a recessed region 115 and are not predetermined to have subsequently formed long-channel devices. The fin region 111 can be an island formed from the substrate that is surrounded by recessed region(s) and delineating trench(es) 116. The recessed region(s) 115 and delineating trench(es) 116 can physically and electrically separate bottom source/drains of individual VT FinFET devices from other neighboring VT FinFET devices and planar long-channel devices.

In one or more embodiments, a recessed region 115 can be formed to a depth, $D_1$, by removing a portion of the substrate 110. The depth, $D_1$, can be greater than an intended height of one or more vertical fins and bottom source/drain region(s) formed from the fin region 111. In various embodiments, the depth, $D_1$, can be in the range of about 20 nm to about 100 nm, or in the range of about 25 nm to about 75 nm, or in the range of about 30 nm to about 50 nm, although other depths are also contemplated. The delineating trench 116 can be formed to the same depth, $D_1$, as the recessed region 115, where the delineating trench 116 and recessed region 115 are formed at the same time. The delineating trench 116 and/or recessed region 115 can be formed by a directional etching process (e.g., RIE).

In one or more embodiments, the recessed region 115 can have a length in the range of about 100 nm to about 2500 nm, or in the range of about 0.5 micron to about 2 microns, or in the range of about 1 micron to about 2 microns. The recessed region 115 can have a width (i.e., into the plane of the figure) in the range of about 20 nm to about 5000 nm, or in the range of about 1 micron to about 2 microns. The recessed region 115 can have a surface area in the range of about 2,000 $nm^2$ to about 12,500,000 $nm^2$, or about 10,000 $nm^2$ to about 1,000,000 $nm^2$, although other dimensions are also contemplated.

In one or more embodiments, the fin region 111 can have a width in the range of about 20 nm to about 800 nm, or in the range of about 40 nm to about 500 nm. The fin region 111 can have a length (i.e., into the plane of the figure) in the range of about 20 nm to about 200 nm, or in the range of about 30 nm to about 100 nm. The fin region 115 can cover a larger area of the substrate than the recessed region 115. In various embodiments, a plurality of vertical fins can be formed in a fin region 111, where each fin region can be used to form a single, multi-fin, VT FinFET.

Figure 5:
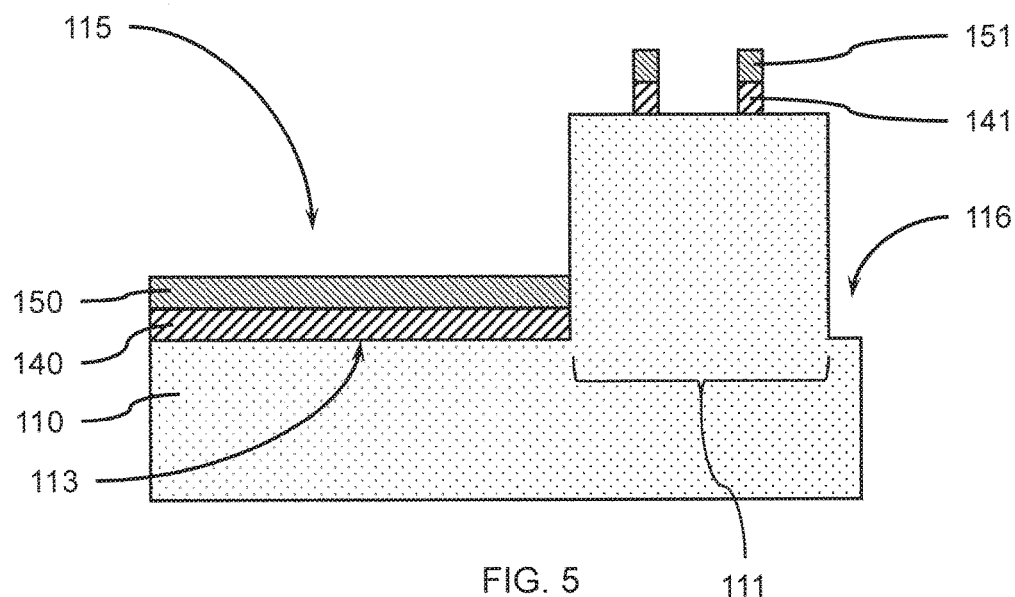
FIG. 5 is a cross-sectional side view showing a fin mask layer and fin template layer formed on the bottom surface of the recessed region, and fin templates and fin mask segments patterned from the fin template layer and fin mask layer formed on the top surface of the fin region, in accordance with an embodiment of the present invention.

FIG. 5 is a cross-sectional side view showing a fin mask layer and fin template layer formed on the bottom surface of the recessed region, and fin templates and fin mask segments patterned from the fin template layer and fin mask layer formed on the top surface of the fin region, in accordance with an embodiment of the present invention.

In one or more embodiments, the masking layer 130 and template layer 120 can be removed from the top surface of the fin region 111, where the masking layer 130 and template layer 120 can be removed using selective isotropic etches (e.g., wet chemical etches) to expose the substrate material of the fin region 111.

In one or more embodiments, a fin template layer 140 can be formed on the surface of the recessed region 115 and fin region 111, where the fin template layer 140 can be blanket deposited on the exposed surfaces. The fin template layer 140 can be formed by CVD, PECVD, PVD, as well as combinations thereof. The fin template layer 140 can be a hardmask that can be patterned to cover and expose different regions of the recessed region 115 and fin region 111.

In various embodiments, the fin template layer 140 can be silicon oxide (SiO), silicon nitride (SiN), silicon oxynitride (SiON), silicon carbonitride (SiCN), silicon boronitride (SiBN), silicon carbide (SiC), silicon borocarbide (SiBC), silicon boro carbonitride (SiBCN), boron carbide (BC), boron nitride (BN), or combinations thereof, where the fin template layer 140 may include one or more layers.

In one or more embodiments, a template masking layer 150 can be formed on the fin template layer 140. The template masking layer 150 can be a softmask, for example, an organic lithography layer, or an extreme ultra violet lithography (EUVL) material, that can be patterned and developed to expose a portion of the underlying fin template layer 140. In one or more embodiments, the template masking layer 150 can be a positive or negative resist material, for example, Poly(methyl methacrylate) (PMMA) or SU-8, or an electron-beam (e-beam) cured material, for example, hydrogen silsesquioxane (HSQ) that can be suitably patterned. In various embodiments, template masking layer 150 can be spun on, deposited by CVD or low pressure CVD (LPCVD).

In one or more embodiments, the template masking layer 150 can be patterned and developed to form template mask segments 151 on the fin template layer 140, where the template mask segments 151 cover portions of the fin template layer 140 and expose other portions of the fin template layer. A portion of the template masking layer can remain on the recessed region 115.

In one or more embodiments, the exposed portions of the fin template layer 140 can be removed by wet etching or by a dry plasma etching, where the dry plasma etch can be a directional reactive ion etch (RIE). Removal of the exposed portions of the fin template layer 140 can form one or more fin templates 141 below the template mask segments 151, and expose underlying portions of the fin region 111. The fin templates 141 can be used to transfer a fin pattern to the material of the fin region 111.

Figure 6:
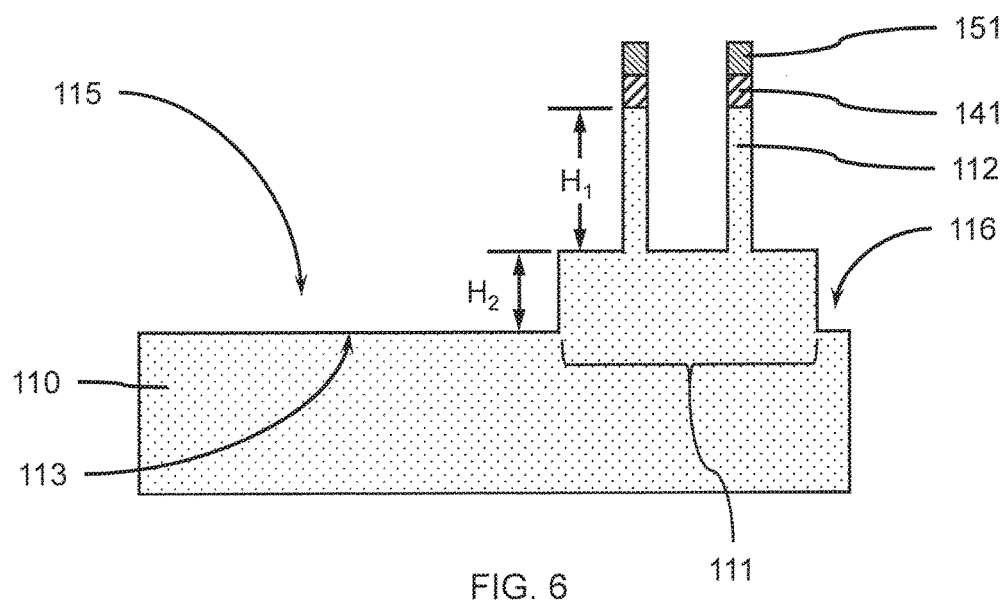
FIG. 6 is a cross-sectional side view showing a plurality of vertical fins formed from a portion of the fin region, and an exposed bottom surface of the recessed region, in accordance with an embodiment of the present invention.

FIG. 6 is a cross-sectional side view showing a plurality of vertical fins formed from a portion of the fin region, and an exposed bottom surface of the recessed region, in accordance with an embodiment of the present invention.

In one or more embodiments, once the fin templates 141 are formed, a directional etch (e.g., RIE) can be used to remove exposed portions of the fin region 111 between and/or around the fin templates 141 to form one or more vertical fins 112 on the underlying substrate 110.

In one or more embodiments, fin trenches can be formed in the fin region 111 to a depth in the range of about 30 nm to about 90 nm, or in the range of about 30 nm to about 50 nm, or about 45 nm, where the vertical fin(s) 112 formed in the fin region 111 can have a resulting height, $H_1$, equal to the depth of the fin trench. The vertical fin(s) 112 can have a straight profile or a tapered profile with a width at the base greater than the width at the top, where the one or more vertical fins extend away from the substrate.

In various embodiments, the depth of etching the vertical fins 112 can be less than the depth, $D_1$, forming the recessed region 115, such that a section of the fin region 111 having a height, $H_2$, remains between the base of the vertical fins 112 and the surface of the recessed region 115. In various embodiments, the height, $H_2$, can be in the range of about 10 nm to about 50 nm, or in the range of about 15 nm to about 35 nm. The height, $H_2$, plus the height, $H_1$, can equal the depth, $D_1$, ($D_1=H_1+H_2$).

In other embodiments, the recessed region 115 and vertical fins 112 and fin trenches can be formed at the same time to an initial depth equal to $H_1$. The vertical fins 112 and fin region 111 can be masked, and a subsequent etch of the recessed region 115 can increase the depth of the recessed region 115 to the final depth, $D_1$, while forming the portion of the fin region with height, $H_2$, below the vertical fins 112.

In one or more embodiments, a plurality of vertical fins 112 can be formed by a sidewall image transfer (SIT) process, self-aligned double patterning (SADP) process, or self-aligned quadruple patterning (SAQP) process, to provide a tight pitch between vertical fins 111. In various embodiments, a direct print can be used to provide the fin templates 141 from the fin template layer 140. Immersion Lithography can direct print down to about 78 nm pitch. Extreme ultraviolet lithography (also known as EUV or EUVL), considered a next-generation lithography technology using an extreme ultraviolet (EUV) wavelength, can direct print down to a pitch smaller than 50 nm. Self-aligned double patterning (SADP) can achieve down to about 40 nm to 60 nm fin pitch. Self-aligned quadruple patterning (SAQP) may be used to go down to below 40 nm fin pitch. While the figures illustrate a direct-write process, this is for descriptive purposes, since these other processes are also contemplated, and the scope of the claims and invention should not be limited to the particular illustrated features.

Figure 7:
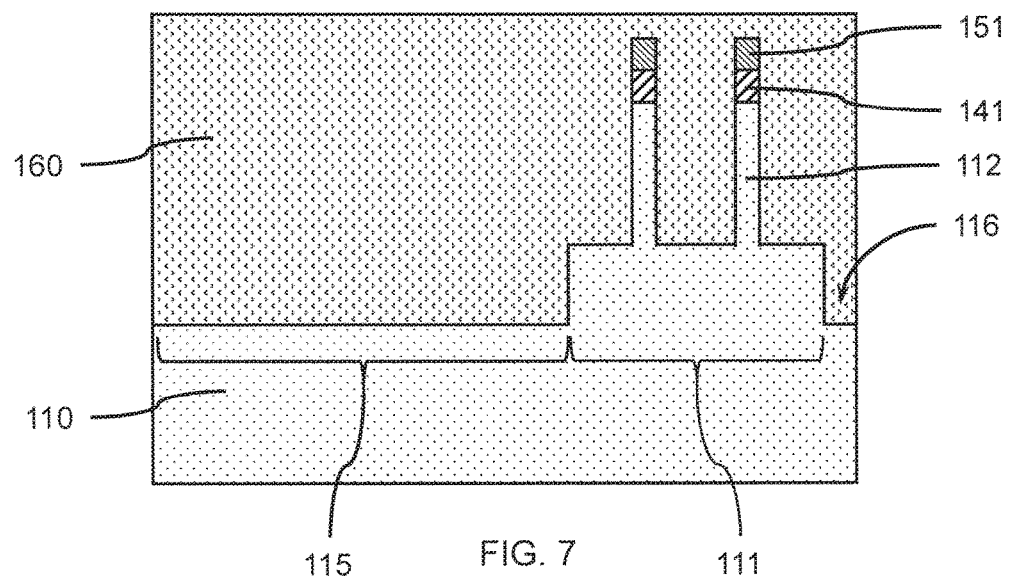
FIG. 7 is a cross-sectional side view showing a sacrificial layer that fills in the recessed region and gaps between the vertical fins formed on the substrate, in accordance with an embodiment of the present invention.

FIG. 7 is a cross-sectional side view showing a sacrificial layer that fills in the recessed region and gaps between the vertical fins formed on the substrate, in accordance with an embodiment of the present invention.

In one or more embodiments, a sacrificial layer 160 can be formed on the recessed region 115, template mask segments 151, fin templates 141, vertical fins 112, and fin region 111. The sacrificial layer 160 can extend above the top surfaces of the template mask segments 151 and fill the delineating trench 116 on one or more sides of the fin region 111.

In one or more embodiments, the sacrificial layer 160 can be can be amorphous silicon (a-Si), poly-silicon (p-Si), amorphous carbon (a-C), silicon-germanium (SiGe), an organic planarization layer (OPL), silicon oxide (SiO), silicon nitride (SiN), or suitable combinations thereof.

In one or more embodiments, the sacrificial layer 160 can be formed by CVD, PECVD, PVD, a spin-on process, or combinations thereof, where the sacrificial layer 160 can be blanket deposited on the substrate 110.

Figure 8:
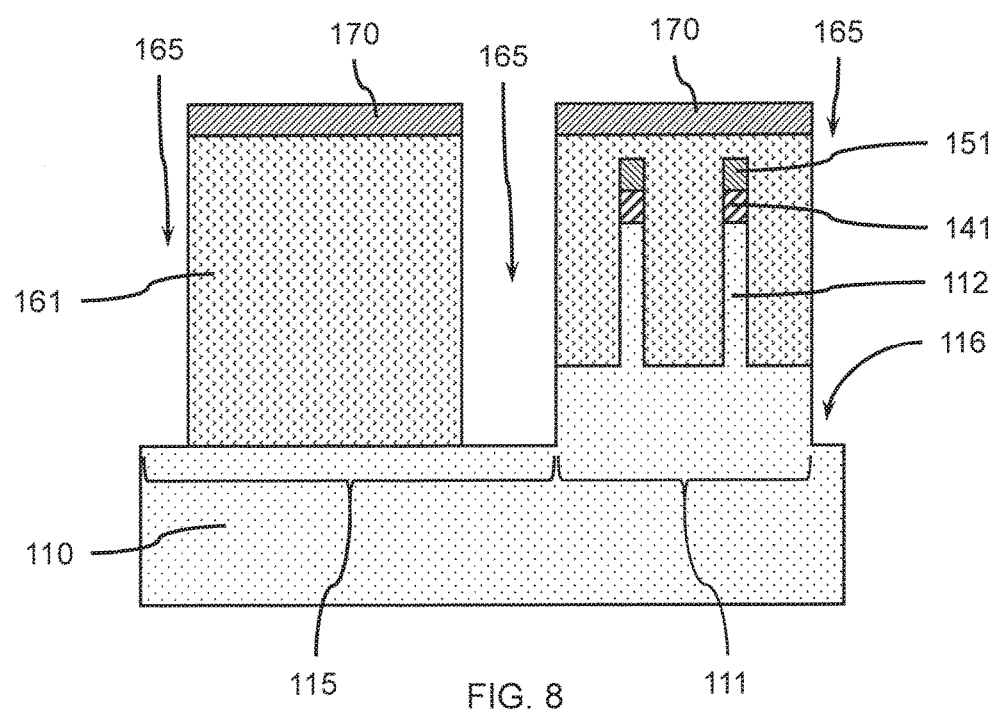
FIG. 8 is a cross-sectional side view showing a cover layer formed and patterned on the sacrificial layer, and a series of channels formed in the sacrificial layer to the substrate surface, in accordance with an embodiment of the present invention.

FIG. 8 is a cross-sectional side view showing a cover layer formed and patterned on the sacrificial layer, and a series of channels formed in the sacrificial layer to the substrate surface, in accordance with an embodiment of the present invention.

In one or more embodiments, a cover layer 170 can be formed on the sacrificial layer 160. The cover layer 170 can be a softmask, for example, an organic lithography layer, or an extreme ultra violet lithography (EUVL) material, that can be patterned and developed to expose a portion of the underlying sacrificial layer 160. In one or more embodiments, the cover layer 170 can be a positive or negative resist material, for example, Poly(methyl methacrylate) (PMMA) or SU-8, or an electron-beam (e-beam) cured material, for example, hydrogen silsesquioxane (HSQ) that can be suitably patterned. In various embodiments, the cover layer 170 can be spun on, deposited by CVD or low pressure CVD (LPCVD).

In one or more embodiments, the cover layer 170 can be patterned and developed to expose a portion of the sacrificial layer 160 adjacent to and/or on opposite sides of the remaining portion of the fin region 111. The opening in the cover layer can have a predetermined width that can define a subsequently formed isolation region between the fin region 111 and the long-channel region 115.

In one or more embodiments, one or more channels 165 can be formed in the sacrificial layer 160, where the channels can extend down to the surface of the substrate. Channels can be formed over the recessed regions 115 and the delineating trenches 116, where the sidewalls of the fin region can be exposed by formation of the channels 165. In various embodiments, the channels can be formed by a directional, selective etch (e.g., RIE).

In one or more embodiments, two or more channels 165 can be formed in a recessed region 115 to define a long-channel region.

Figure 9:
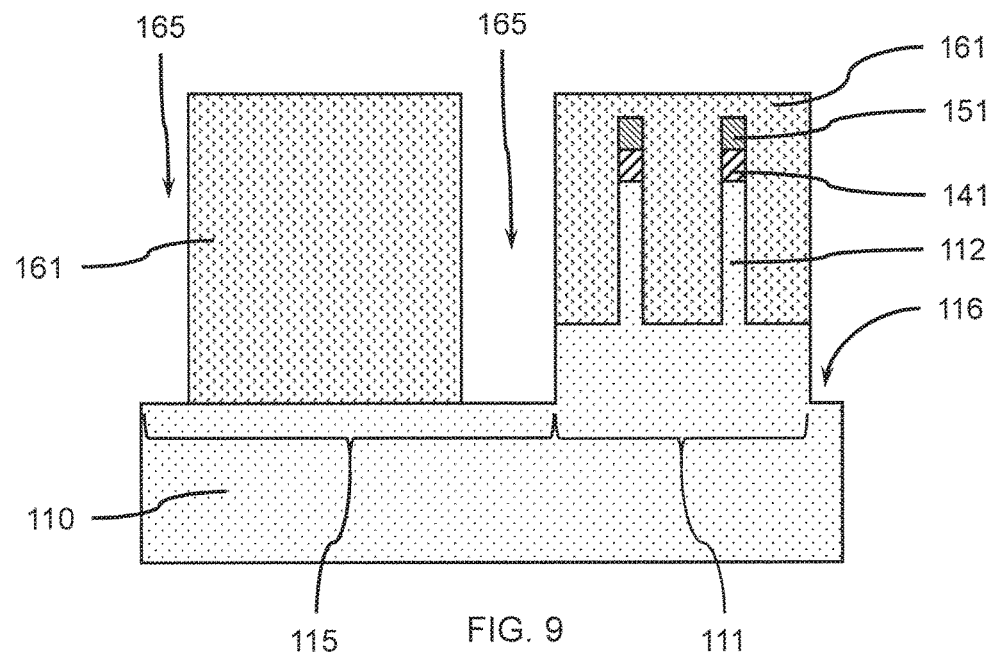
FIG. 9 is a cross-sectional side view showing the sacrificial layer exposed after removal of the patterned cover layer, in accordance with an embodiment of the present invention.

FIG. 9 is a cross-sectional side view showing the sacrificial layer exposed after removal of the patterned cover layer, in accordance with an embodiment of the present invention.

In one or more embodiments, the cover layer 170 can be removed from the sacrificial layer 160, for example, using chemical stripping, ashing, or an isotropic wet etch.

Figure 10:
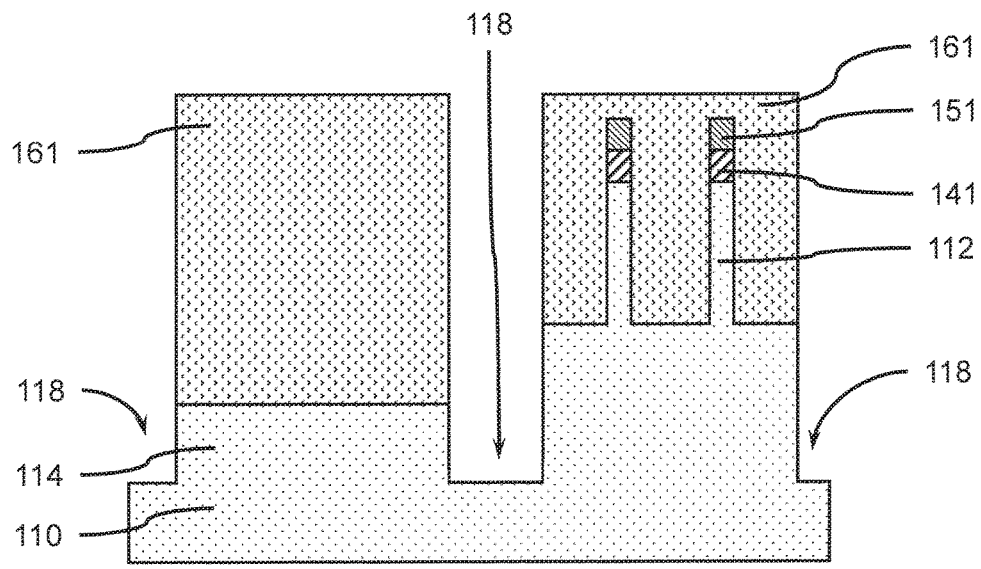
FIG. 10 is a cross-sectional side view showing two segregating trenches formed in the substrate, and the delineating trench extended further into the substrate, in accordance with an embodiment of the present invention.

FIG. 10 is a cross-sectional side view showing two segregating trenches formed in the substrate, and the delineating trench extended further into the substrate, in accordance with an embodiment of the present invention.

In one or more embodiments, two or more segregating trenches 118 can be formed in the recessed region 115 by removing portions of the substrate 110 exposed at the bottom of channels 165. The segregating trenches 118 can be formed by a selective directional etch (e.g., RIE), where the width of the segregating trenches 118 can be determined by the widths of the channels 165. Formation of the segregating trenches 118 can form a long-channel pillar 114 from the substrate 110. Formation of a segregating trench 118 between the long-channel pillar 114 and fin region 111 can provide for an isolation region between a long-channel device and a VT FinFET device. The depth of the delineating trench(es) 116 can be extended further into the substrate 110 to form segregating trench(es) 118 below the level of the top surface of a long-channel pillar 114.

In one or more embodiments, the segregating trenches 118 can be formed to a depth, $D_2$, in the range of about 5 nm to about 50 nm, or in the range of about 10 nm to about 40 nm, although other depths are also contemplated. The depth, $D_2$, of the segregating trenches 118 can define a height of the long-channel pillar 114. In various embodiments, segregating trenches 118 may not be formed, and a planar long-channel device may be formed in the surface of the substrate in the recessed region 115.

In various embodiments, the long-channel pillar 114 can have a length in the range of about 100 nm to about 600 nm, or in the range of about 150 nm to about 500 nm, although other dimensions are also contemplated. The length of the long-channel pillar 114 can provide a channel length for a planar long-channel FET device. The long-channel pillar 114 can have a width (i.e., into the plane of the figure) in the range of about 20 nm to about 5000 nm, or in the range of about 50 nm to about 1000 nm, although other dimensions are also contemplated. The long-channel pillar 114 can be suitably dimensioned to form a plurality of long-channel field effect devices in the recessed region 115.

Formation of the channels 165 and segregating trenches 118 can leave a sacrificial layer block 161 on each of the long-channel pillar(s) 114 and fin region 111.

Figure 11:
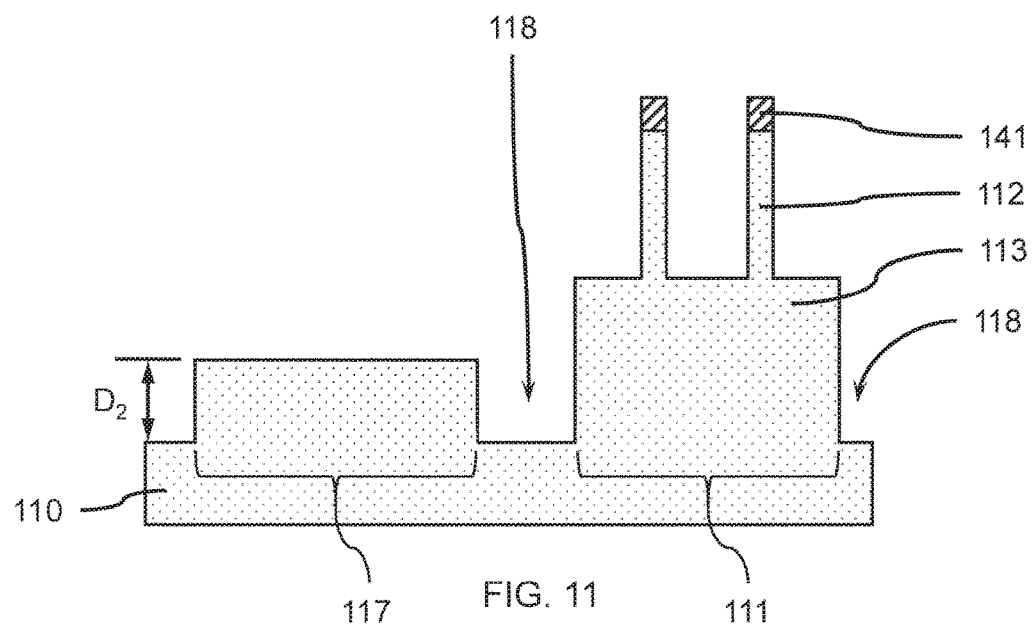
FIG. 11 is a cross-sectional side view showing a segregating trench on opposite sides of a long-channel region, after removal of the sacrificial layer, where a segregating trench separates the long-channel region from the fin region, in accordance with an embodiment of the present invention.

FIG. 11 is a cross-sectional side view showing a segregating trench on opposite sides of a long-channel region, after removal of the sacrificial layer, where a segregating trench separates the long-channel region from the fin region, in accordance with an embodiment of the present invention.

In one or more embodiments, the sacrificial layer 160 and/or sacrificial layer blocks 161 can be removed to expose the long-channel pillar 114, vertical fins 112, and fin region 111. The sacrificial layer 160 and/or sacrificial layer blocks 161 can be removed using a selective isotropic etch (e.g., wet chemical etch, dry plasma etch, etc.). A segregating trench 118 can be on opposite sides of a long-channel region 117, after removal of the sacrificial layer 160 and sacrificial layer blocks 161, where a segregating trench 118 can separate the long-channel region 117 from the fin region 111. A segregating trench 118 can isolate the fin region 111 from other neighboring regions.

In one or more embodiments, the template mask segments 151 can be removed from the fin templates 141, where a selective isotropic etch can be used.

In one or more embodiments, the top surface of the long-channel pillar 114 is below the bottom of the vertical fins 112 and top surface of the vertical fin block 113.

Figure 12:
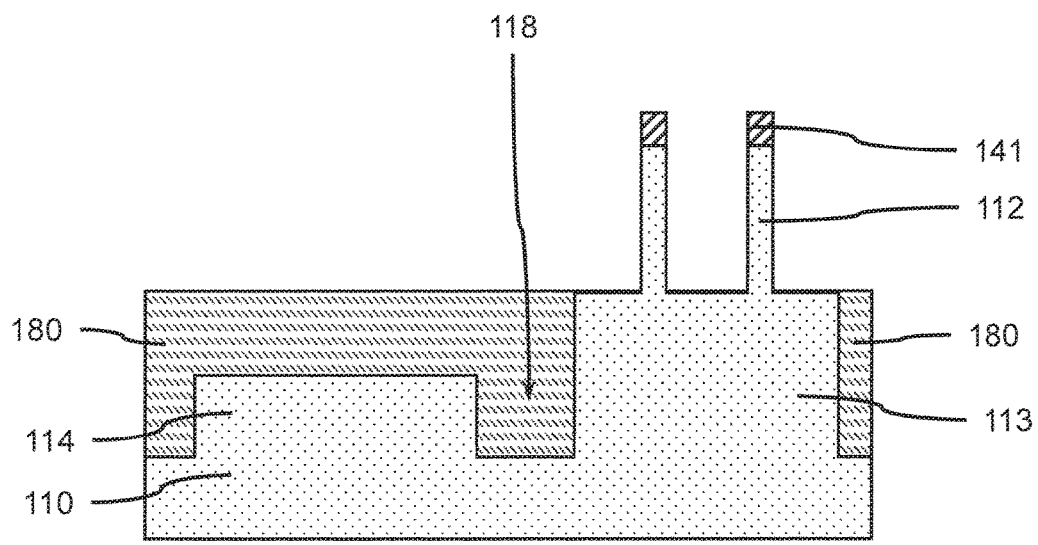
FIG. 12 is a cross-sectional side view showing a fill layer in the segregating trenches and covering the long-channel region, in accordance with an embodiment of the present invention.

FIG. 12 is a cross-sectional side view showing a fill layer in the segregating trenches and covering the long-channel region, in accordance with an embodiment of the present invention.

In one or more embodiments, a fill layer 180 can be formed on the substrate 110, where the fill layer 180 can cover the long-channel pillar 114, vertical fins 112, and fin templates 141. The fill layer 180 can be blanket deposited, for example, by flowable CVD, high aspect ratio process (HARP), PVD, or combinations thereof, where the thickness of the fill layer 180 can extend above the top surface of the fin templates 141. The fill layer 180 can be etched back (e.g., by RIE or wet etch) after formation to expose the vertical fins 112 and the top surface of the vertical fin block 113 in fin region 111, wherein at least a portion of the fill layer 180 can remain in the segregating trenches 118 and on the long-channel pillar 114. In various embodiments, the fill layer 180 can be an insulating, dielectric material, including, but not limited to silicon oxide (SiO), silicon oxy carbide (SiOC), silicon oxynitride (SiON), and combinations thereof.

Figure 13:
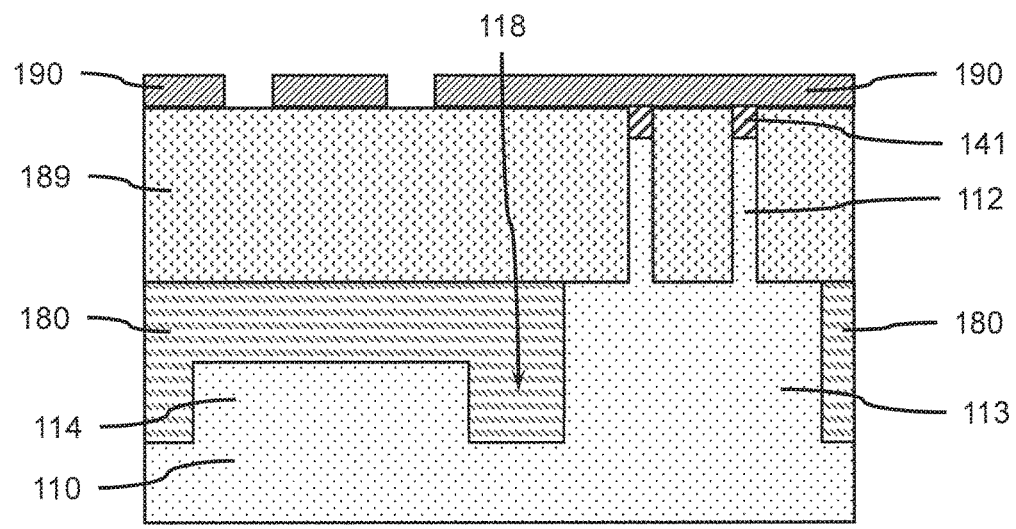
FIG. 13 is a cross-sectional side view showing a patterned resist layer formed on an organic planarization layer and the fill layer that provides exposed portions of the fill layer surface, in accordance with an embodiment of the present invention.

FIG. 13 is a cross-sectional side view showing a patterned resist layer formed on an organic planarization layer and the fill layer that provides exposed portions of the fill layer surface, in accordance with an embodiment of the present invention.

In one or more embodiments, an organic planarization layer (OPL) 189 can be formed on the remaining portions of the fill layer 180 and exposed surface of the vertical fin block 113.

In one or more embodiments, a resist layer 190 can be formed and patterned on the OPL 189 and fill layer 180, where the resist layer can be an organic lithography layer or an extreme ultra violet lithography (EUVL) material, that can be patterned and developed to expose a portion of the underlying OPL 189. In various embodiments, the resist layer 190 can be patterned and developed to expose a portion of the OPL 189 above the long-channel pillar 114. The position of openings in the resist layer can be above predetermined locations of source/drains on the long-channel devices.

Figure 14:
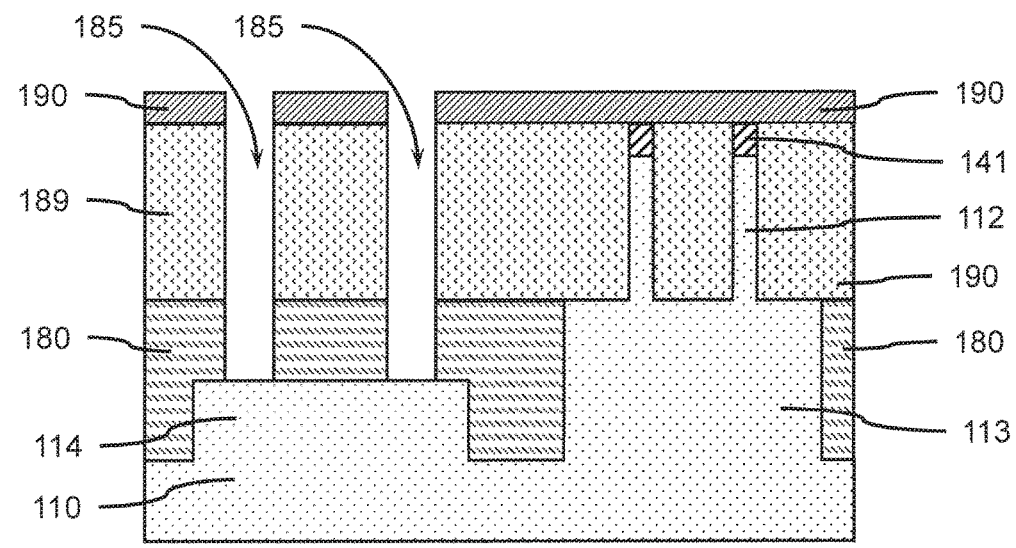
FIG. 14 is a cross-sectional side view showing access passages formed in the fill layer to the long-channel region, in accordance with an embodiment of the present invention.

FIG. 14 is a cross-sectional side view showing access passages formed in the fill layer to the long-channel region, in accordance with an embodiment of the present invention.

In one or more embodiments, access passages 185 can be formed in the OPL 189 and fill layer 180, where the access passages 185 can be formed by a directional etching process (e.g., RIE). The access passages 185 can be configured and dimensioned to be the size, shape, and location of source/drains to be formed on the long-channel pillar 114. A portion of the long-channel pillar 114 can be exposed at the bottom of an access passage 185. The distance between two access passages 185 can define a channel length for a long-channel device.

Figure 15:
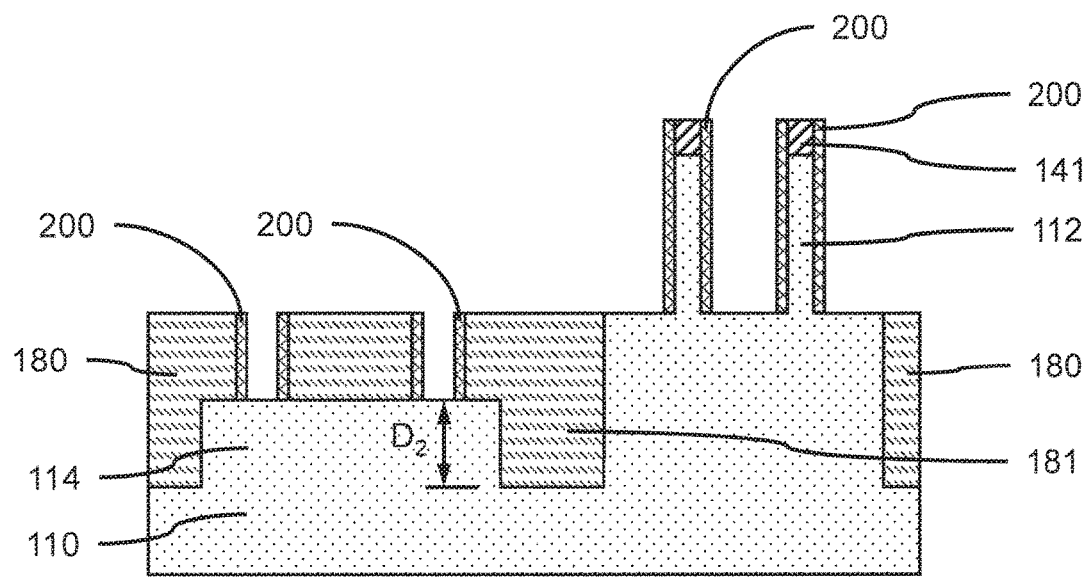
FIG. 15 is a cross-sectional side view showing liners formed on the vertical surfaces of the access passages and sidewalls of the vertical fins, in accordance with an embodiment of the present invention.

FIG. 15 is a cross-sectional side view showing liners formed on the vertical surfaces of the access passages and sidewalls of the vertical fins, in accordance with an embodiment of the present invention.

In one or more embodiments, the resist layer 190 and OPL 189 can be removed after formation of the access passages 185 to expose the surface of the fill layer 180 and fin region 111. A portion of the fill layer 180 can remain in the segregating trenches 118, where the fill layer filled segregating trenches 118 can form isolation regions adjacent to and/or between the long-channel pillar 114 and fin region 111.

In one or more embodiments, a liner 200 can be formed on the fill layer 180, including on the walls of the access passages 185, and on the exposed surface of the long-channel pillar 114 at the bottom of the access passages 185. The liner 200 can be formed by a conformal deposition, for example, ALD, PEALD, and combinations thereof, where the liner is formed on the exposed surfaces. The portions of the liner 200 can be removed from horizontal surfaces by a directional etching process (e.g., RIE), while leaving portions of the liner 200 on vertical surfaces, including the sidewalls of the access passages 185 and the sidewalls of the vertical fins 112 and fin templates 141.

In one or more embodiments, the liner 200 can be silicon nitride (SiN), silicon oxynitride (SiON), silicon oxycarbide (SiOC), silicon carbonitride (SiCN), silicon oxycarbonitride (SiOCN), silicon boronitride (SiBN), silicon carbide (SiC), silicon borocarbide (SiBC), silicon boro carbonitride (SiBCN), boron carbide (BC), boron nitride (BN), or combinations thereof.

In various embodiments, the liners 200 can prevent the vertical fin sidewalls from providing a surface for expitaxial growth of source/drain material, so formation of source/drains is restricted to the exposed surfaces at the bottom of access passages 185 and source/drain troughs 119. The liners 200 can act as additional gate spacers to physically and electrically separate conductive gate electrodes from source/drain contacts.

Figure 16:
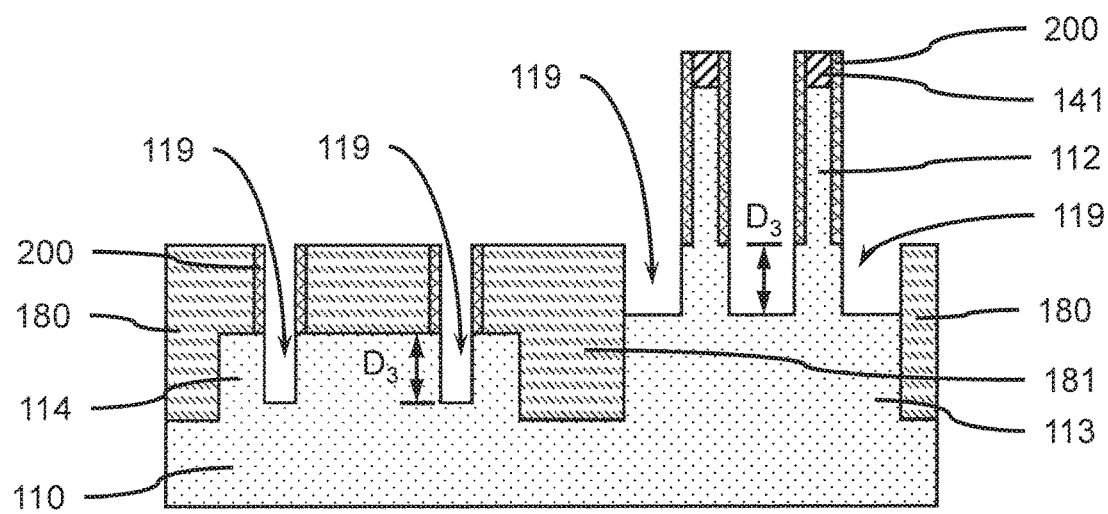
FIG. 16 is a cross-sectional side view showing source/drain troughs formed in the long-channel region and adjacent to the vertical fins, in accordance with an embodiment of the present invention.

FIG. 16 is a cross-sectional side view showing source/drain troughs formed in the long-channel region and adjacent to the vertical fins, in accordance with an embodiment of the present invention.

In one or more embodiments, source/drain troughs 119 can be formed in the channel pillar 114 and in the vertical fin block 113 in the fin region 111 adjacent to the vertical fins 112. The source/drain troughs 119 can be formed by directional, selective etching (e.g., RIE), in which the source/drain troughs 119 in the long-channel pillar 114 and in the vertical fin block 113 can be formed at the same time with the same directional etching step. The source/drain troughs 119 can be utilized to form source/drains on both the long-channel device and vertical FinFET device.

In one or more embodiments, the source/drain troughs 119 can be formed to a depth, $D_3$, in the range of about 10 nm to about 80 nm, or in the range of about 20 nm to about 60 nm, where $D_3$ can be less than the height of the long-channel pillar 114 defined by the depth, $D_2$, of the segregating trenches 118.

Figure 17:
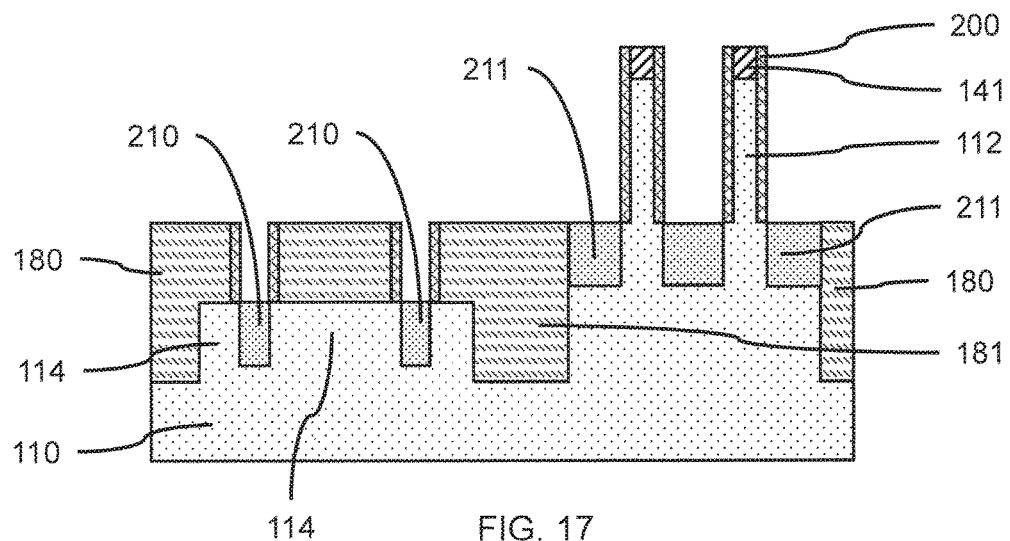
FIG. 17 is a cross-sectional side view showing bottom source/drain plugs formed in the source/drain troughs adjacent to the vertical fins, and long-channel source/drain plugs formed in the source/drain troughs in the long-channel region, in accordance with an embodiment of the present invention.

FIG. 17 is a cross-sectional side view showing bottom source/drain plugs formed in the source/drain troughs adjacent to the vertical fins, and long-channel source/drain plugs formed in the source/drain troughs in the long-channel region, in accordance with an embodiment of the present invention.

In one or more embodiments, long-channel source/drain plugs 210 can be formed in the source/drain troughs 119 in the long-channel pillar 114. The long-channel source/drain plugs 210 can be formed by epitaxial growth on single crystal long-channel pillar 114 material, where the long-channel source/drain plugs 210 can be single crystal. In various embodiments, the epitaxial, long-channel source/drain plugs 210 can be formed by vapor phase epitaxy (VPE), ion beam epitaxy (IBE), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing chemical vapor deposition (LRPCVD), molecular beam epitaxy (MBE), liquid-phase epitaxy (LPE), or other suitable processes.

In various embodiments, the long-channel source/drain plugs 210 can be highly doped, where the doping can be in the range of about $5 \times 10^{18}$ to about $1 \times 10^{22}$, or in the range of about $5 \times 10^{18}$ to about $3 \times 10^{21}$, or in the range of about $5 \times 10^{19}$ to about $1 \times 10^{21}$, or in the range of about $1 \times 10^{21}$ to about $1 \times 10^{22}$ atoms/cm$^3$.

In one or more embodiments, bottom source/drain plugs 211 can be formed in the source/drain troughs 119 adjacent to the vertical fins 112. The bottom source/drain plugs 211 can be formed by epitaxial growth on single crystal substrate 110 material in the fin region 111, where the bottom source/drain plugs 211 can be single crystal. In various embodiments, the epitaxial, bottom source/drain plugs 211 can be formed by vapor phase epitaxy (VPE), ion beam epitaxy (IBE), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing chemical vapor deposition (LRPCVD), molecular beam epitaxy (MBE), liquid-phase epitaxy (LPE), or other suitable processes. The bottom source/drain plugs 211 and long-channel source/drain plugs 210 can be grown to a predetermined thickness.

In various embodiments, the bottom source/drain plugs 211 can be highly doped, where the doping can be in the range of about $5 \times 10^{18}$ to about $1 \times 10^{22}$, or in the range of about $5 \times 10^{18}$ to about $3 \times 10^{21}$, or in the range of about $5 \times 10^{19}$ to about $1 \times 10^{21}$, or in the range of about $1 \times 10^{21}$ to about $1 \times 10^{22}$ atoms/cm$^3$.

In one or more embodiments, the bottom source/drain plugs 211 and long-channel source/drain plugs 210 can be suitably doped to form n-type devices (e.g., with phosphorus, arsenic, and/or antimony), or p-type devices (e.g., with boron, gallium, and/or indium). The bottom source/drain plugs 211 and long-channel source/drain plugs 210 can be doped in situ (i.e., during epitaxial growth), or ex situ (i.e., after growing the layer expitaxially). In various embodiments, the bottom source/drain plugs 211 and long-channel source/drain plugs 210 can be formed by any suitable doping techniques, including but not limited to, ion implantation, gas phase doping, plasma doping, plasma immersion ion implantation, cluster doping, infusion doping, liquid phase doping, solid phase doping, etc.

Figure 18:
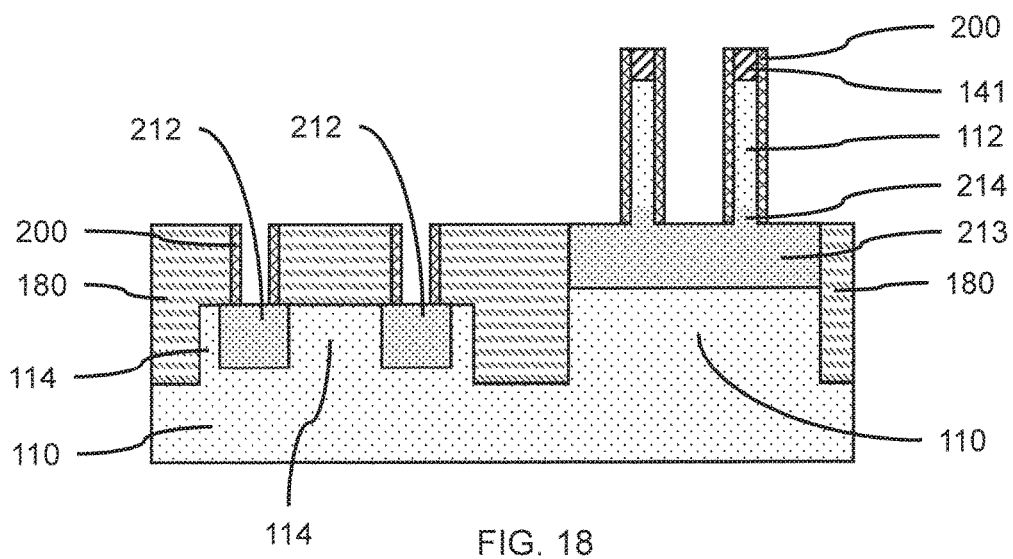
FIG. 18 is a cross-sectional side view showing a bottom source/drain and extension region formed below the vertical fins and long-channels source/drains formed in the long-channel pillar, after heat treatment, in accordance with an embodiment of the present invention.

FIG. 18 is a cross-sectional side view showing a bottom source/drain and extension region formed below the vertical fins and long-channels source/drains formed in the long-channel pillar, after heat treatment, in accordance with an embodiment of the present invention.

In one or more embodiments, the vertical fins 112 and substrate 110 with the bottom source/drain plugs 211 and long-channel source/drain plugs 210 can be heat treated to activate the dopant species, setting the bottom junction, and/or recrystallizing the bottom source/drain plugs 211 and long-channel source/drain plugs 210 in the event that the bottom source/drain plugs 211 and long-channel source/drain plugs 210 are damaged/amorphized due to implantation. The dopant can diffuse from the bottom source/drain plugs 211 and long-channel source/drain plugs 210 into adjoining portions of the vertical fin block 113, vertical fins 112, and long-channel pillar 114, respectively, to form long-channel source/drains 212 and bottom source/drain 213 for the subsequent devices. The diffusion can be lateral into adjoining undoped sections. A portion of the dopant can diffuse into the lower section of the vertical fins 112 to form an extension region 214 that can define an effective gate length. In one or more embodiments, the long-channel pillar 114 is at a different elevation on the substrate, where the long-channel pillar 114 is below the bottom of the bottom source/drain 213 in the fin region 111. In various embodiments, the substrate 110 can be n-doped or p-doped to provide a counter-doped well for the long-channel source/drains 212 and bottom source/drain 213, where the counter-doped substrate 110 can create a depletion region below and/or adjacent to the long-channel source/drains 212 and bottom source/drain 213.

In one or more embodiments, the heat treatment can be a furnace anneal or a rapid thermal anneal, where the anneal is conducted at a temperature in the range of about 800° C. to about 1100° C., for a time in the range of about 1 seconds to about 10 seconds.

Figure 19:
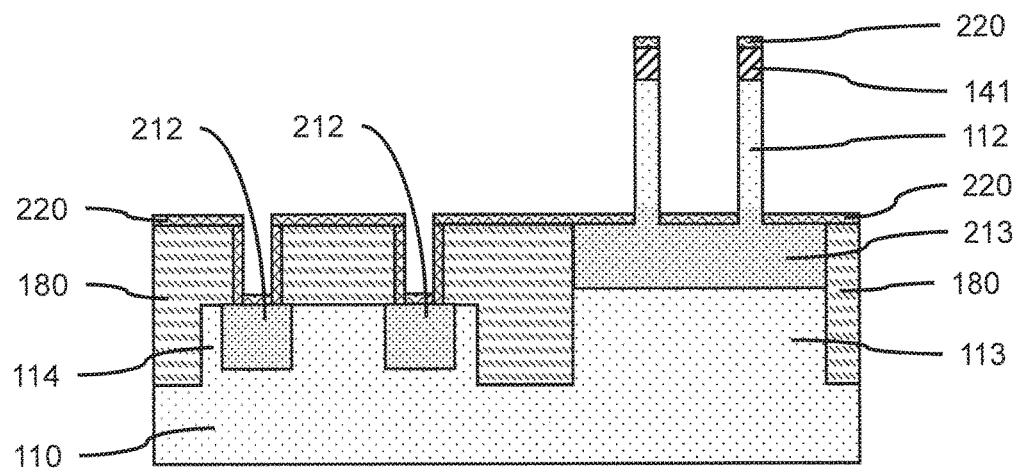
FIG. 19 is a cross-sectional side view showing a bottom spacer layer formed on the horizontal surfaces of the long-channels source/drains, fill layer, and fin templates, in accordance with an embodiment of the present invention.

FIG. 19 is a cross-sectional side view showing a bottom spacer layer formed on the horizontal surfaces of the long-channel source/drains, fill layer, and fin templates, in accordance with an embodiment of the present invention.

In one or more embodiments, a bottom spacer layer 220 can be formed on the horizontal surfaces of the long-channel source/drains 212, bottom source/drain 213, fill layer 180, and fin templates 141. The bottom spacer 220 can be formed by a directional deposition, for example, by high density plasma (HDP) depositions, gas cluster ion beam (GCIB), or combinations thereof, and etched back (e.g., by a selective and isotropic wet or dry etch), where material deposited on vertical surfaces is removed.

In one or more embodiments, the bottom spacer layer 220 can be a silicon oxide (SiO), a silicon oxycarbide (SiOC), a silicon nitride (SiN), a silicon oxynitride (SiON), a silicon carbonitride (SiCN), a silicon oxycarbonitride (SiOCN), a silicon boronitride (SiBN), a silicon borocarbide (SiBC), a silicon boro carbonitride (SiBCN), a boron carbide (BC), a boron nitride (BN), a low-K dielectric material, or a combination thereof. A low-k dielectric material can include, but not be limited to, a fluoride-doped silicon oxide (e.g., fluoride doped glass), a silicon oxycarbide (SiOC), a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof.

Figure 20:
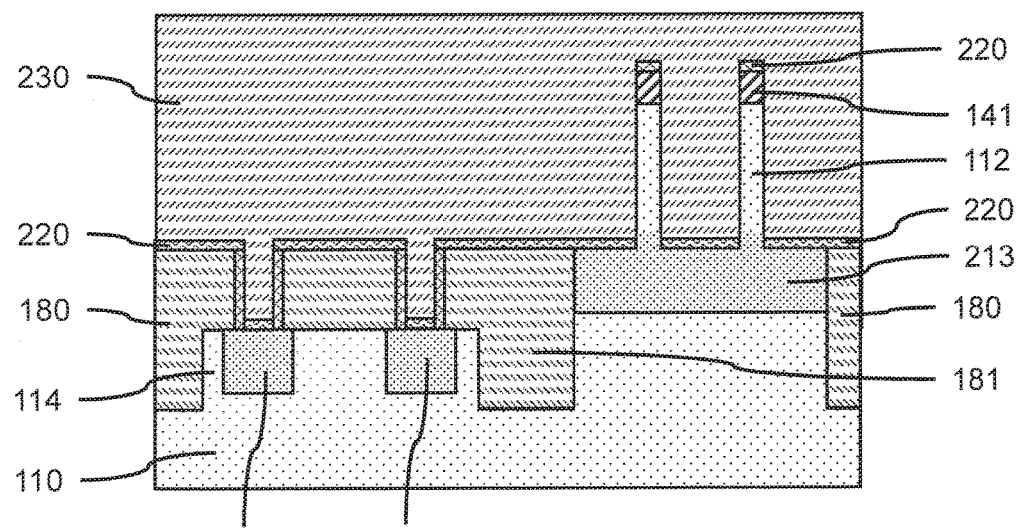
FIG. 20 is a cross-sectional side view showing an interlayer dielectric (ILD) layer formed on the bottom spacer layer and vertical fins, in accordance with an embodiment of the present invention.

FIG. 20 is a cross-sectional side view showing an interlayer dielectric (ILD) layer formed on the bottom spacer layer and vertical fins, in accordance with an embodiment of the present invention.

In one or more embodiments, an interlayer dielectric (ILD) layer 230 can be formed on the top spacer layer 220, exposed portions of the vertical fins 112, and the fin templates 141. The interlayer dielectric layer 230 can extend above the top surfaces of the fin templates 141 and bottom spacer layer 220. the interlayer dielectric (ILD) layer 230 can be formed by a blanket deposition, for example, CVD, PECVD, LPCVD, spun on, or a combination thereof.

In one or more embodiments, the ILD layer 230 can be silicon oxide (SiO), a low-k dielectric, a flowable polymeric material, or a combination thereof. A low-k dielectric material can include, but not be limited to, a fluoride-doped silicon oxide (e.g., fluoride doped glass), a silicon oxycarbide (SiOC), a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof.

Figure 21:
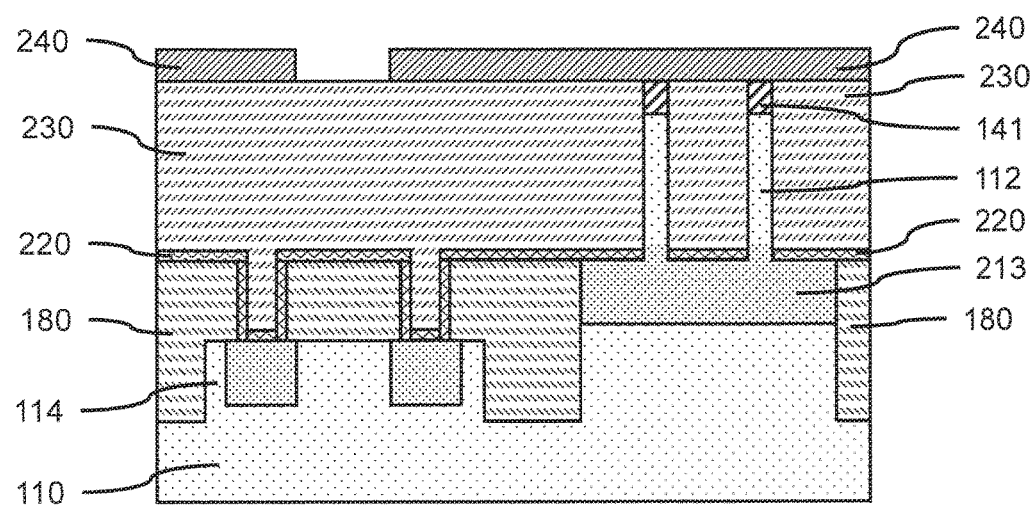
FIG. 21 is a cross-sectional side view showing a patterned gate mask layer formed on the ILD layer after reducing the height, in accordance with an embodiment of the present invention.

FIG. 21 is a cross-sectional side view showing a patterned gate mask layer formed on the ILD layer after reducing the height, in accordance with an embodiment of the present invention.

In one or more embodiments, a gate mask layer 240 (e.g., a lithography resist) can be formed and patterned on the exposed surface of the ILD layer 230, where one or more openings are formed in the gate mask layer 240. The position of the openings can expose portions of the ILD layer 230 where gate structures are to be subsequently formed. The openings can be above a central portion of the long-channel pillar 114 between the long-channel source/drains 212.

Figure 22:
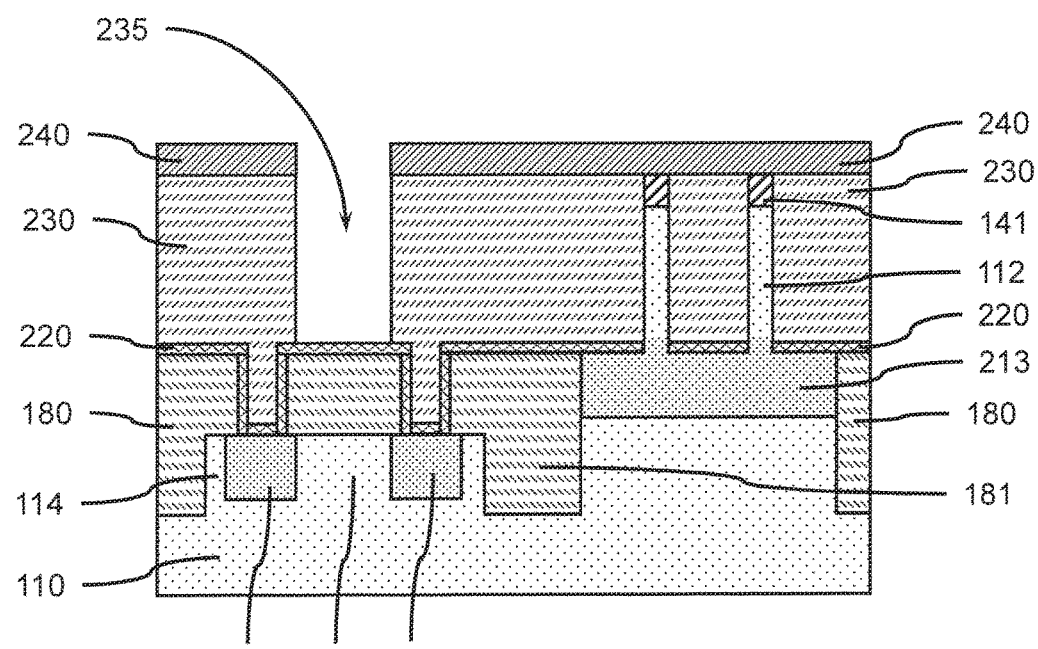
FIG. 22 is a cross-sectional side view showing a gate opening formed in the ILD layer, in accordance with an embodiment of the present invention.

FIG. 22 is a cross-sectional side view showing a gate opening formed in the ILD layer, in accordance with an embodiment of the present invention.

In one or more embodiments, a gate opening 235 formed in the ILD layer 230, where the gate opening can be formed by a direction etch (e.g., RIE). Formation of the gate opening can expose a portion of the bottom spacer 220 on the long-channel pillar 114 between the long-channel source/drains 212. The width of the gate opening can define the width of a subsequently formed gate structure, and a channel length of a channel formed in the long-channel pillar 114.

Figure 23:
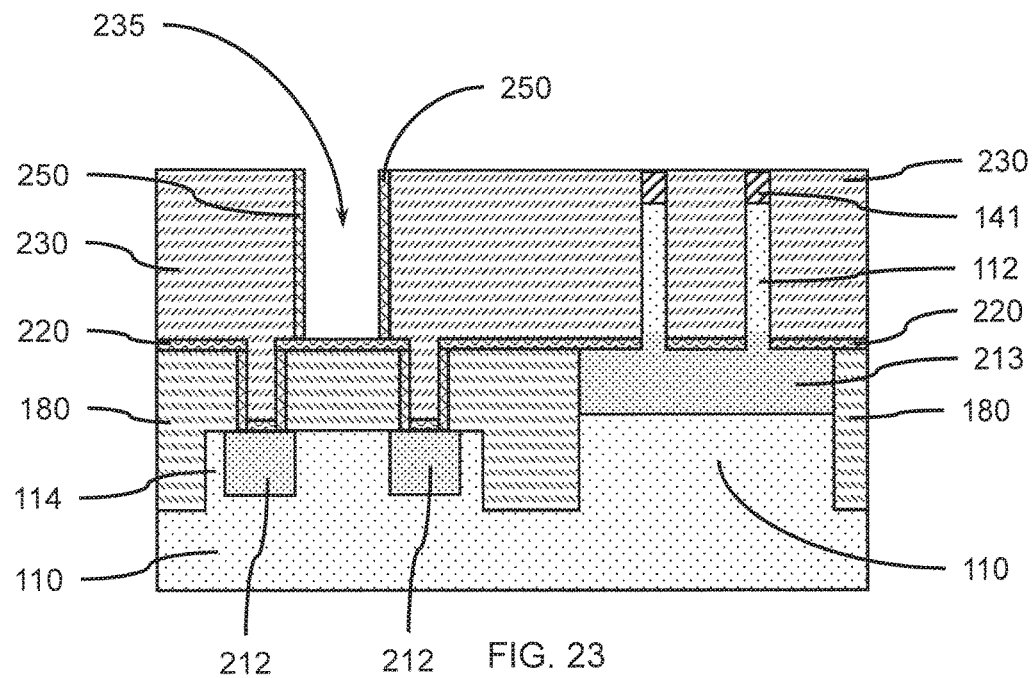
FIG. 23 is a cross-sectional side view showing gate sidewall spacers formed on the sidewall surfaces of the ILD layer exposed by formation of the gate opening, in accordance with an embodiment of the present invention.

FIG. 23 is a cross-sectional side view showing gate sidewall spacers formed on the sidewall surfaces of the ILD layer exposed by formation of the gate opening, in accordance with an embodiment of the present invention.

In one or more embodiments, gate sidewall spacers 250 can be formed on the sidewall surfaces of the ILD layer 230 exposed by formation of the gate opening 235, where the gate sidewall spacers 250 can be formed by a conformal deposition (e.g., ALD, PEALD) and portions of the gate sidewall spacer removed from vertical surfaces by an etch-back process.

In one or more embodiments, the gate sidewall spacers 250 can be silicon nitride (SiN), silicon oxynitride (SiON), silicon carbonitride (SiCN), silicon oxycarbonitride (SiOCN), silicon boronitride (SiBN), silicon oxycarbide (SiOC), or combinations thereof.

Figure 24:
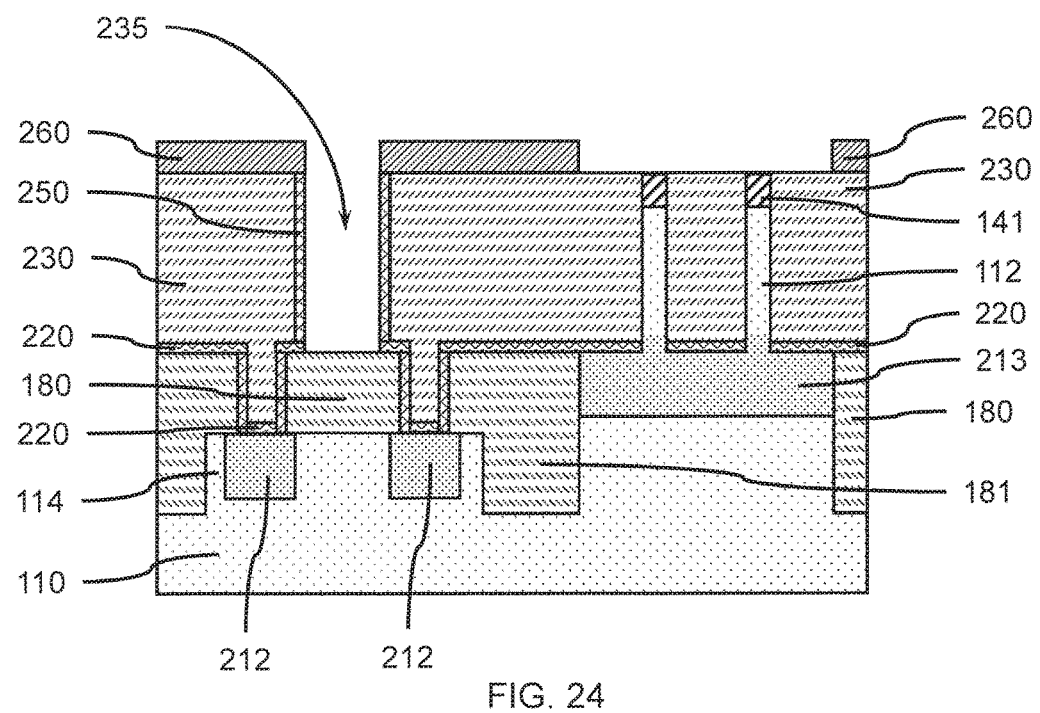
FIG. 24 is a cross-sectional side view showing a patterned protective mask layer exposing the ILD layer on the fin region and removal of the bottom spacer layer from within the gate opening, in accordance with an embodiment of the present invention.

FIG. 24 is a cross-sectional side view showing a patterned protective mask layer exposing the ILD layer on the fin region and removal of the bottom spacer layer from within the gate opening, in accordance with an embodiment of the present invention.

In one or more embodiments, the portion of the bottom spacer layer 220 can be removed from the surface of the fill layer 180 at the bottom of the gate opening 235 (e.g., by RIE).

In one or more embodiments, a protective mask layer 260 (e.g., a lithography resist) can be formed and patterned on the exposed surface of the ILD layer 230 and gate sidewall spacers 250, where one or more openings are formed in the protective mask layer 260. The position of the openings can expose portions of the fin region 111 and the top surfaces of the fin templates 141, where gate structures are to be subsequently formed on the vertical fins 112. A portion of the protective mask layer 260 can be removed from the bottom of the gate opening to expose the fill layer 180.

Figure 25:
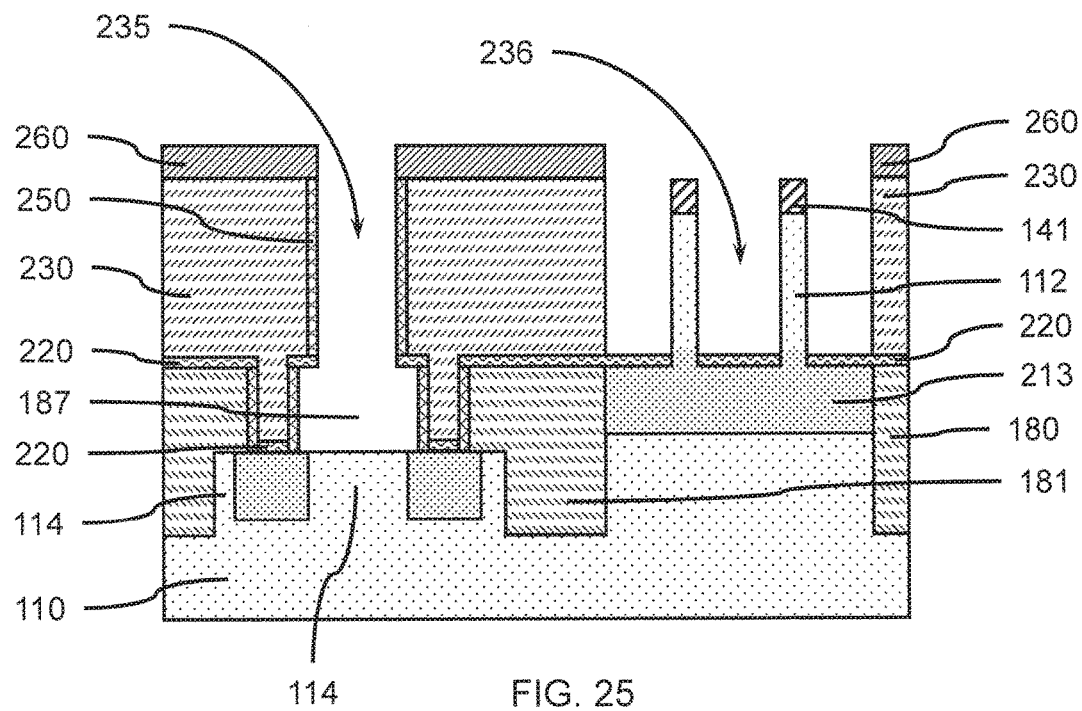
FIG. 25 is a cross-sectional side view showing formation of a gate cavity adjacent to the long channel and fin gaps exposing the vertical fins by removal of portions of the ILD layer, in accordance with an embodiment of the present invention.

FIG. 25 is a cross-sectional side view showing formation of a gate cavity adjacent to the long channel and fin gaps exposing the vertical fins by removal of portions of the ILD layer, in accordance with an embodiment of the present invention.

In one or more embodiments, the portion of the fill layer 180 material at the bottom of the gate opening 235 can be removed to form a gate cavity 187, and the portion of the ILD layer 230 adjacent to the vertical fins 112 can be removed to form fin gaps 236, where removal can be, for example, by an isotropic wet chemical etch or dry plasma etch. The gate cavity 187 can be wider than the gate opening 235 to form an inverted "T" shape, where the wider "T" shape is directly above a central section of the long-channel pillar 114. The fill layer 180 and the ILD layer 230 can be the same material or different materials with essentially the same etching rate and properties, so both the fill layer 180 and the ILD layer 230 can be removed by the same etching process.

In one or more embodiments, the protective mask layer 260 can be removed after formation of the gate cavity 187 and the fin gaps 236.

Figure 26:
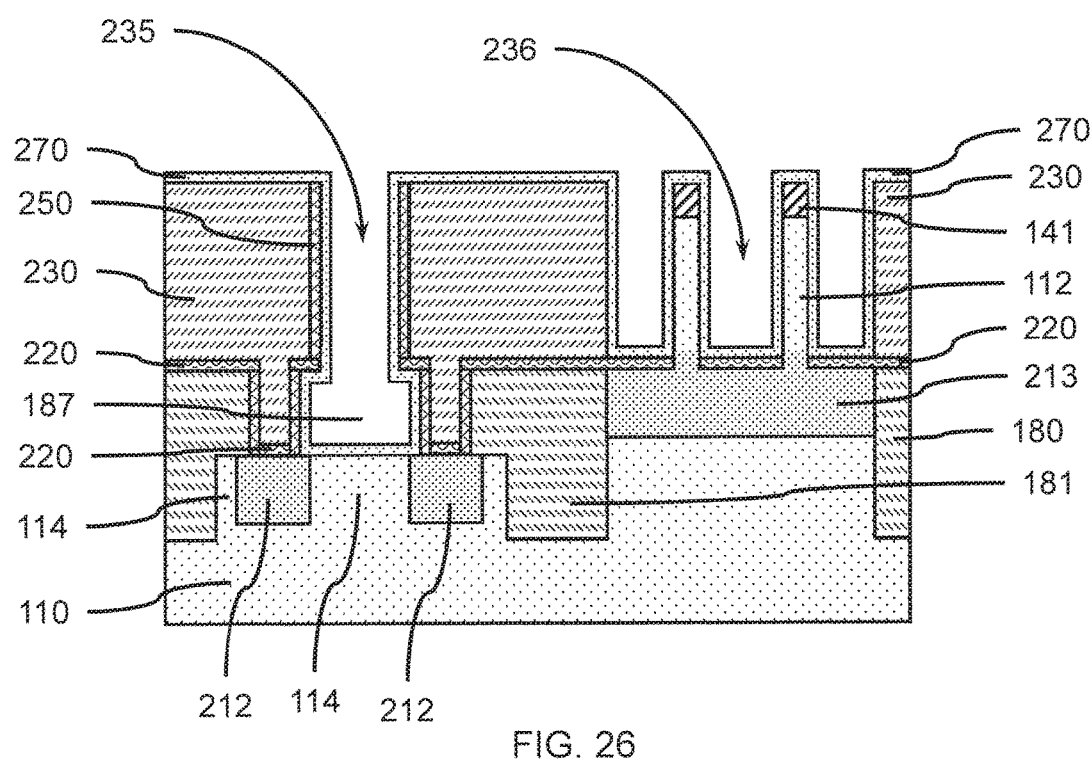
FIG. 26 is a cross-sectional side view showing a gate dielectric layer formed on the ILD layer, gate spacers, long channel, and vertical fins, in accordance with an embodiment of the present invention.

FIG. 26 is a cross-sectional side view showing a gate dielectric layer formed on the ILD layer, gate spacers, long channel, and vertical fins, in accordance with an embodiment of the present invention.

In one or more embodiments, a gate dielectric layer 270 can be formed on the exposed surfaces of the ILD layer 230, gate sidewall spacers 250, vertical fins 112, and fin templates 141, where the gate dielectric layer 270 can be conformally deposited (e.g., by ALD, PEALD, CVD). The gate dielectric layer 270 can be formed on the walls of the gate cavity 187 and on the sidewalls of the vertical fins 112.

In one or more embodiments, the gate dielectric layer 270 can be an insulating dielectric layer, for example, a silicon oxide (SiO), silicon nitride (SiN), silicon oxynitride (SiON), a high-K dielectric, or a suitable combination of these materials.

In various embodiments, the gate dielectric layer 270 can be a high-K dielectric material that can include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide (Pb($Sc_xTa_{1-x}$)$O_3$), and lead zinc niobate (e.g., $PbZn_{1/3}Nb_{2/3}O_3$). The high-k material can further include dopants such as lanthanum and/or aluminum. The stoichiometry of the high-K compounds can vary.

In one or more embodiments, the gate dielectric layer 270 can have a thickness in the range of about 1 nm to about 4 nm, or can have a thickness in the range of about 1 nm to about 2 nm.

Figure 27:
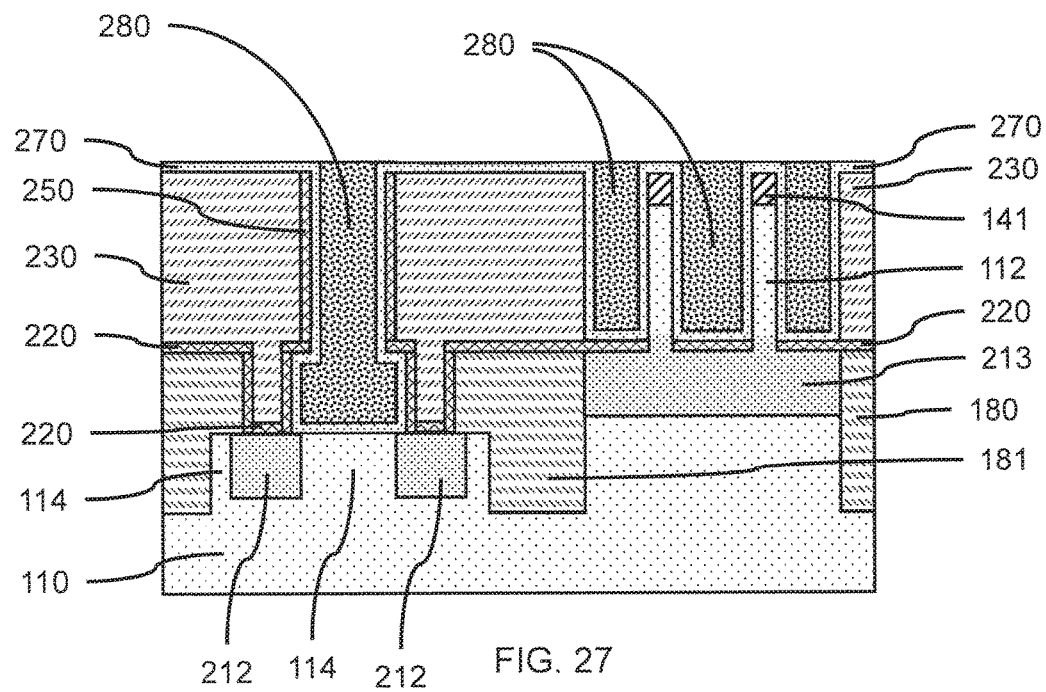
FIG. 27 is a cross-sectional side view showing a gate electrode formed on the gate dielectric in the gate opening, gate cavity, and fin gaps, in accordance with an embodiment of the present invention.

FIG. 27 is a cross-sectional side view showing a gate electrode formed on the gate dielectric in the gate opening, gate cavity, and fin gaps, in accordance with an embodiment of the present invention.

In one or more embodiments, a work function layer can be formed on the exposed surfaces of the gate dielectric layer 270, where the work function layer can be conformally deposited by ALD, PEALD, CVD, PECVD, or combinations thereof.

In one or more embodiments, a work function layer can be formed on the gate dielectric layer 270, where the work function layer and gate dielectric layer can surround at least a portion of each of one or more vertical fin(s) 112 as a part of a gate structure. The work function layer can be formed on the gate dielectric layer to adjust the electrical properties of a gate electrode. In various embodiments, the work function layer can be optional. A portion of the work function layer can be formed on the gate dielectric layer on the sidewalls of the vertical fins 112, and fin templates 141. In various embodiments, different work function layers can be formed for the n-type FinFETs and p-type FinFETs, respectively.

In various embodiments, a work function layer can be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer 165 can include multiple layers of work function materials, for example, a work function layer can be a TiN/TiC stack.

In various embodiments, the work function layer can have a thickness in the range of about 1 nm to about 11 nm, or can have a thickness in the range of about 3 nm to about 5 nm.

In one or more embodiments, a gate fill layer can be formed on the gate dielectric layer and/or work function layer if present, where the gate fill layer can fill in the space between vertical fins 111. The gate fill layer, gate dielectric layer, and optionally the work function layer, can form a gate structure on one or more vertical fin(s) 112, and/or long-channel pillar 114, where the gate fill layer and work function layer can form a conductive gate electrode.

In various embodiments, the gate fill layer can be doped polycrystalline or amorphous silicon, germanium, silicongermanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

Figure 28:
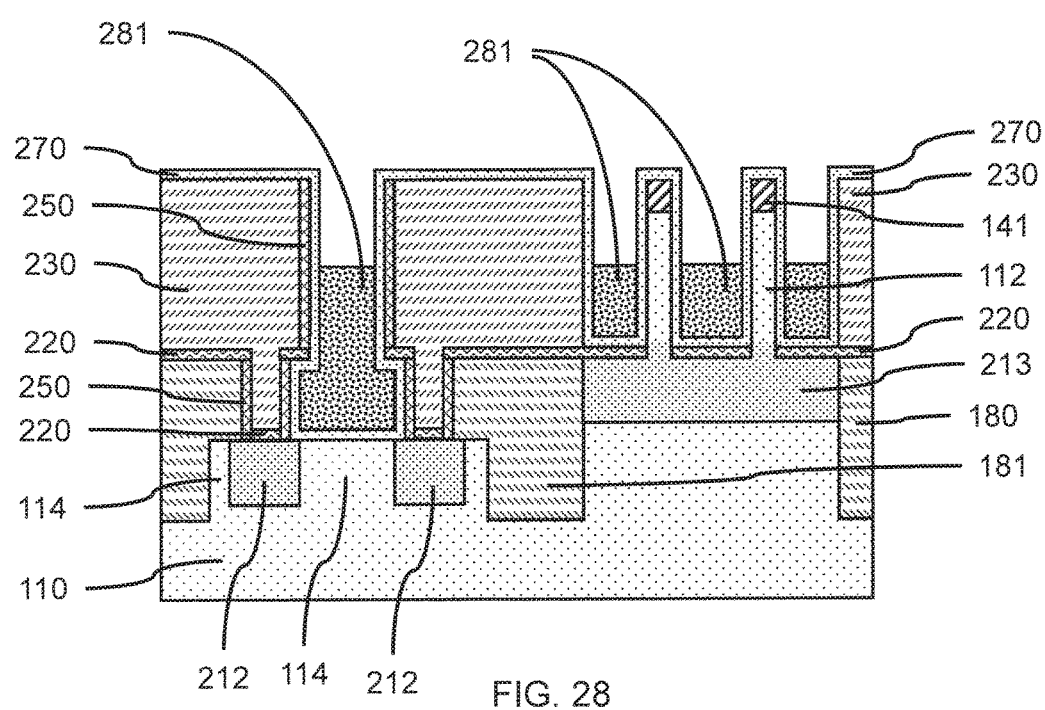
FIG. 28 is a cross-sectional side view showing a gate electrode with a reduced height within the gate opening and fin gaps, in accordance with an embodiment of the present invention.

FIG. 28 is a cross-sectional side view showing a gate electrode with a reduced height within the gate opening and fin gaps, in accordance with an embodiment of the present invention.

In one or more embodiments, a portion of the gate electrode 280, including the gate fill layer and optional work function layer can be removed to reduce the height of the gate electrode below the surface of the ILD layer 230. A selective, isotropic etch (e.g., wet etch, dry plasma etch) can be used to remove the material of each the gate fill layer and optional work function layer.

In various embodiments, the height of the gate electrode 280 can be reduced to below the top surface of the vertical fins 112, where the reduced height gate electrode 281 can define a gate length for a FinFET. In various embodiments, the gate electrode 280 can be recessed sufficiently to expose an upper section of the vertical fin(s) 112, where about ½ to about ⅙ of the vertical fin(s) 112 can be exposed by recessing the gate electrode. The portion of the gate electrode 280 in the gate cavity 187 and the portion of the gate electrode 280 in the gate opening 235 along with the gate dielectric layer 270 can form an inverted T-shaped gate structure on the long-channel device.

Figure 29:
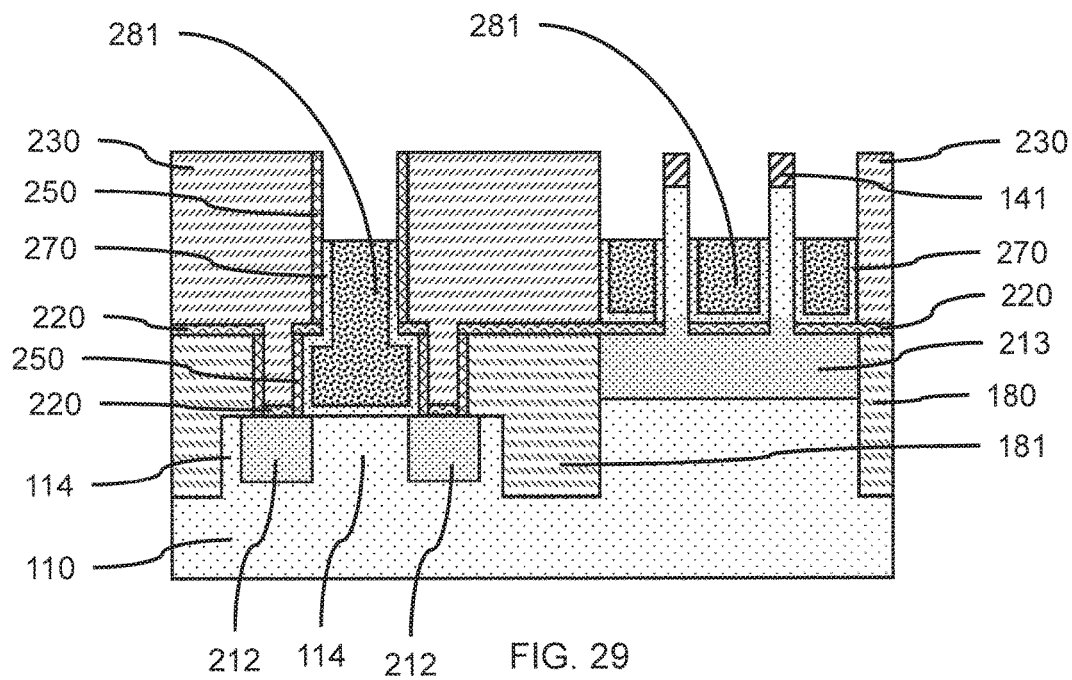
FIG. 29 is a cross-sectional side view showing exposed ILD layer surfaces, gate spacer surfaces, and vertical fins, after removal of a portion of the gate dielectric layer, in accordance with an embodiment of the present invention.

FIG. 29 is a cross-sectional side view showing exposed ILD layer surfaces, gate spacer surfaces, and vertical fins, after removal of a portion of the gate dielectric layer, in accordance with an embodiment of the present invention.

In one or more embodiments, the portion of the gate dielectric layer 270 can be removed from the horizontal surfaces of the ILD layer 230 and vertical surfaces of the gate sidewall spacers 250 and vertical fins 112.

Figure 30:
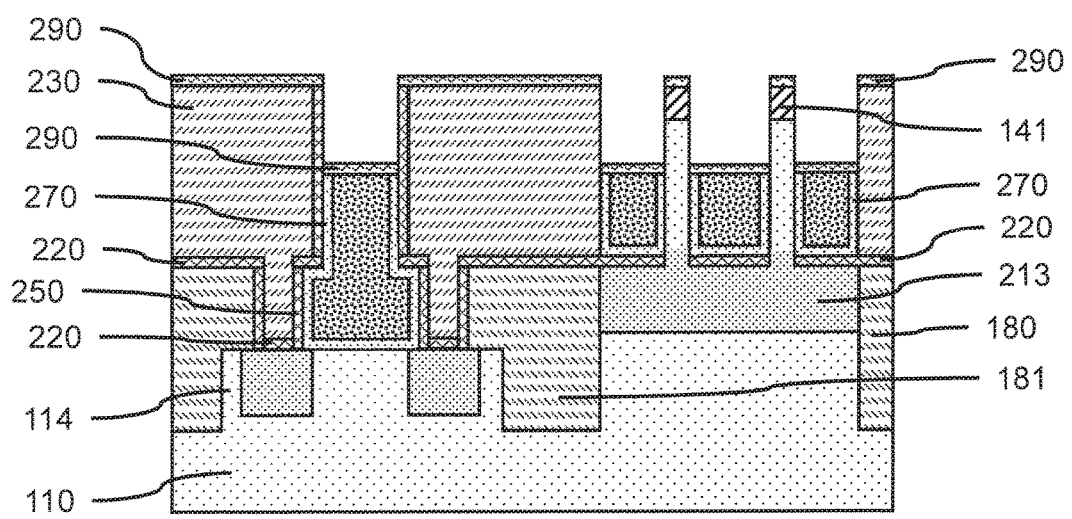
FIG. 30 is a cross-sectional side view showing a top spacer formed on the exposed surfaces of the ILD layer, fin templates, and gate electrodes, in accordance with an embodiment of the present invention.

FIG. 30 is a cross-sectional side view showing a top spacer formed on the exposed surfaces of the ILD layer, fin templates, and gate electrodes, in accordance with an embodiment of the present invention.

In one or more embodiments, a top spacer layer 290 can be formed on the horizontal surfaces of the ILD layer 230, the exposed surfaces of the reduced height gate electrodes 281, and fin templates 141. The top spacer layer 290 can be formed by a directional deposition, for example, by high density plasma (HDP) depositions, gas cluster ion beam (GCIB), or combinations thereof, and material deposited on vertical surfaces removed by an isotropic etch.

In one or more embodiments, the top spacer layer 290 can be a silicon oxide (SiO), a silicon oxycarbide (SiOC), a silicon nitride (SiN), a silicon oxynitride (SiON), a silicon carbonitride (SiCN), a silicon oxycarbonitride (SiOCN), a silicon boronitride (SiBN), a silicon borocarbide (SiBC), a silicon boro carbonitride (SiBCN), a boron carbide (BC), a boron nitride (BN), a low-K dielectric material, or a combination thereof. A low-k dielectric material can include, but not be limited to, a fluoride-doped silicon oxide (e.g., fluoride doped glass), a silicon oxycarbide (SiOC), a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof.

Figure 31:
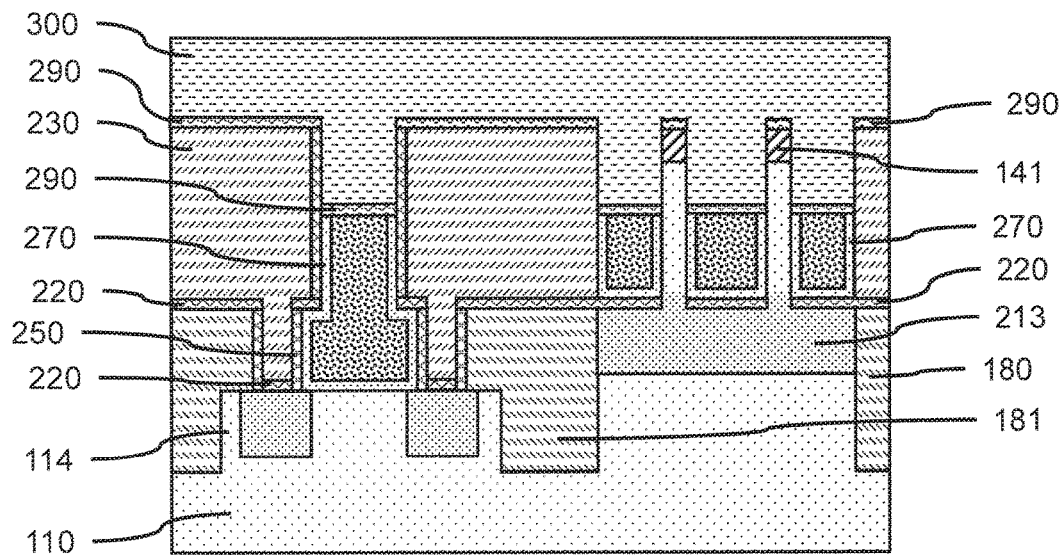
FIG. 31 is a cross-sectional side view showing a planarization layer formed in the gate opening and fin gaps, in accordance with an embodiment of the present invention.

FIG. 31 is a cross-sectional side view showing a planarization layer formed in the gate opening and fin gaps, in accordance with an embodiment of the present invention.

In one or more embodiments, a planarization layer 300 can be formed on the top spacer layer 290, where the planarization layer 300 can be blanket deposited.

In various embodiments, the planarization layer 300 can be a silicon oxide (SiO), a low-K dielectric material, or a combination thereof.

Figure 32:
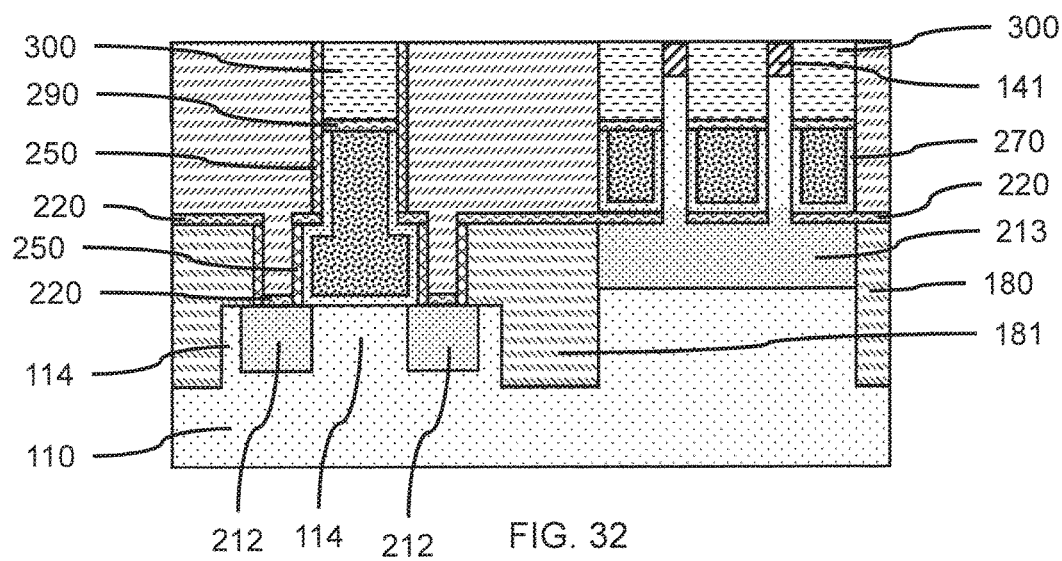
FIG. 32 is a cross-sectional side view showing the planarization layer with a reduced height and removal of the top spacer layer from the ILD layer and fin template top surfaces, in accordance with an embodiment of the present invention.

FIG. 32 is a cross-sectional side view showing the planarization layer with a reduced height and removal of the top spacer layer from the ILD layer and fin template top surfaces, in accordance with an embodiment of the present invention.

In one or more embodiments, a portion of the planarization layer 300 extending above the ILD layer 230 and the portion of the top spacer layer 290 on the fin templates 141 can be removed, for example, by a chemical-mechanical polishing (CMP) to expose the top surfaces of the fin templates 141 and the ILD layer 230. A portion of the planarization layer 300 can remain in the gate opening 235 and fin gaps 236 reopened by reducing the height of the gate electrode.

Figure 33:
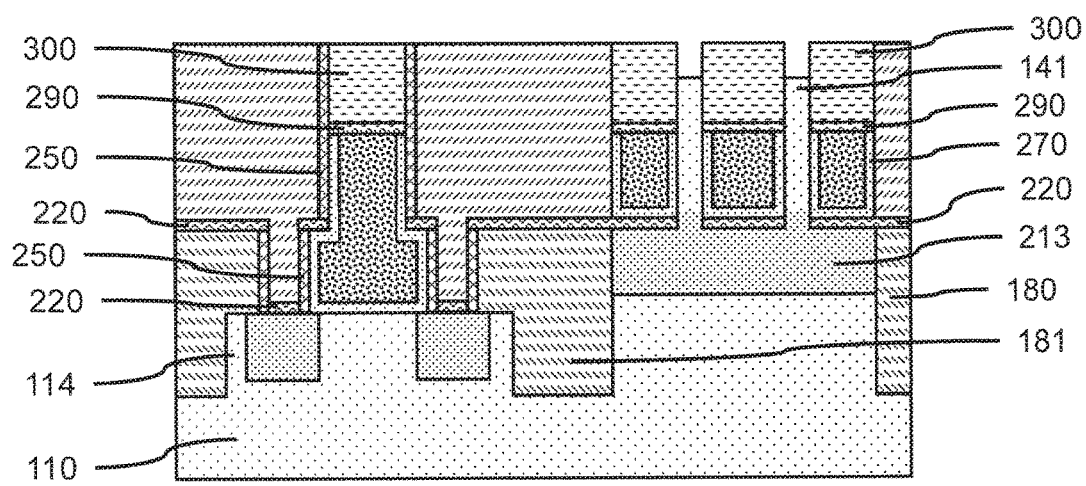
FIG. 33 is a cross-sectional side view showing spaces formed in the planarization layer by removal of the fin templates, in accordance with an embodiment of the present invention.

FIG. 33 is a cross-sectional side view showing spaces formed in the planarization layer by removal of the fin templates, in accordance with an embodiment of the present invention.

In one or more embodiments, the fin templates 141 can be removed by a selective etch to expose the top surfaces of the vertical fins 112 between portions of the planarization layer 300. The top surfaces of the vertical fins 112 can be below the surface of the planarization layer 300.

Figure 34:
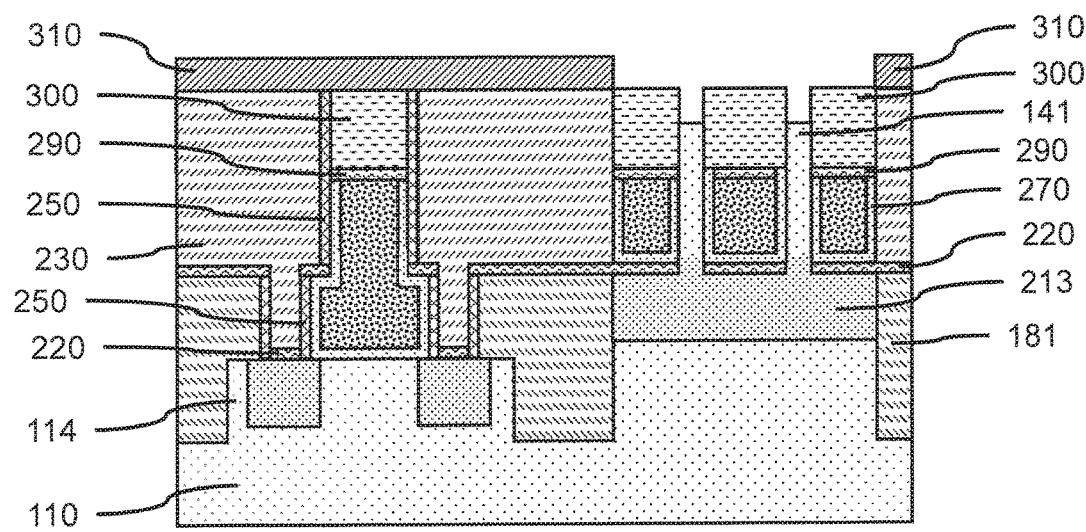
FIG. 34 is a cross-sectional side view showing a source/drain mask formed on the ILD layer and a portion of the planarization layer, while exposing a portion of the planarization layer on the fin region, in accordance with an embodiment of the present invention.

FIG. 34 is a cross-sectional side view showing a source/drain mask formed on the ILD layer and a portion of the planarization layer, while exposing a portion of the planarization layer on the fin region, in accordance with an embodiment of the present invention.

In one or more embodiments, a source/drain mask 310 can be formed on the ILD layer 230 and a portion of the planarization layer 300. The source/drain mask can be patterned to expose a portion of the planarization layer 300 adjacent to the vertical fins 112 on the fin region 111.

Figure 35:
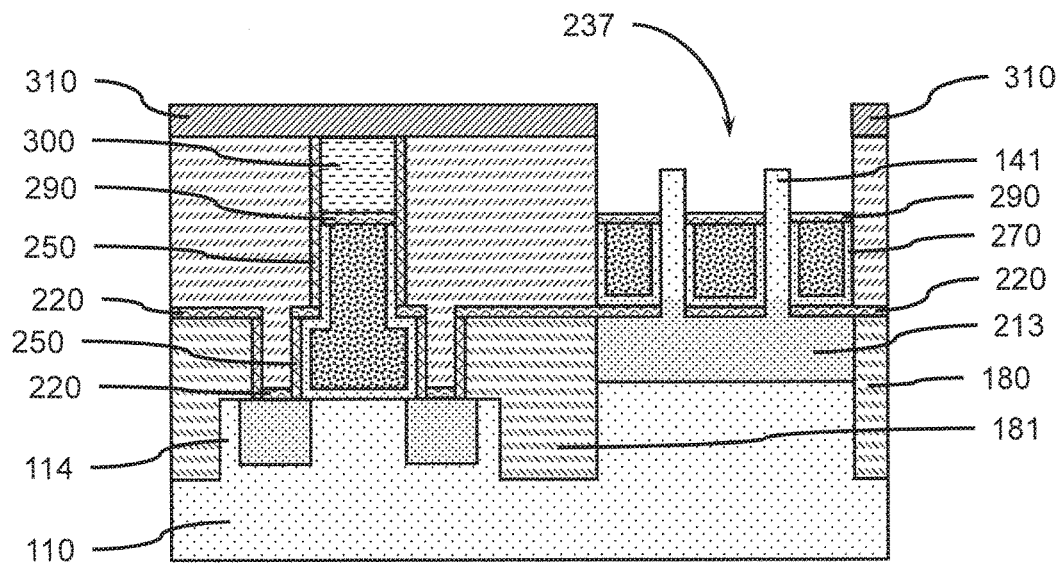
FIG. 35 is a cross-sectional side view showing exposed top spacer layer and upper sections of the vertical fins in a source/drain trough, in accordance with an embodiment of the present invention.

FIG. 35 is a cross-sectional side view showing exposed top spacer layer and upper sections of the vertical fins in a source/drain trough, in accordance with an embodiment of the present invention.

In one or more embodiments, the planarization layer 300 in the fin region 111 can be removed to form a source/drain trough 237 between portions of the ILD layer 230. The sidewalls of an upper section of the vertical fins 112 can be exposed by removal of the unmasked portion of the planarization layer 300, where the unmasked portion of the planarization layer can be removed by a selective directional etch (e.g., RIE), or a selective isotropic etch (e.g., wet chemical etch) if the ILD layer and planarization layer are different materials.

Figure 36:
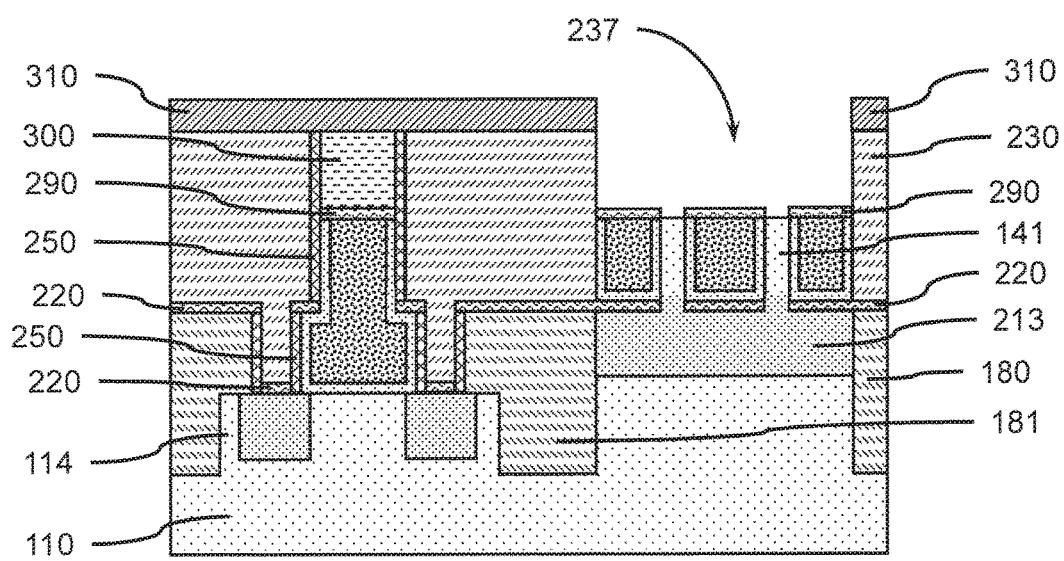
FIG. 36 is a cross-sectional side view showing reduced height vertical fins, in accordance with an embodiment of the present invention.

FIG. 36 is a cross-sectional side view showing reduced height vertical fins, in accordance with an embodiment of the present invention.

In one or more embodiments, the exposed portion of the vertical fins 112 extending above the top surface of the top spacer layer 290 can be removed, where the portion of the vertical fins 112 can be removed by a selective directional etch. Removal of a portion of the vertical fins 112 can decrease the effective gate length. The top spacer layer 290 can act as an etch-stop layer to protect the underlying gate structures.

Figure 37:
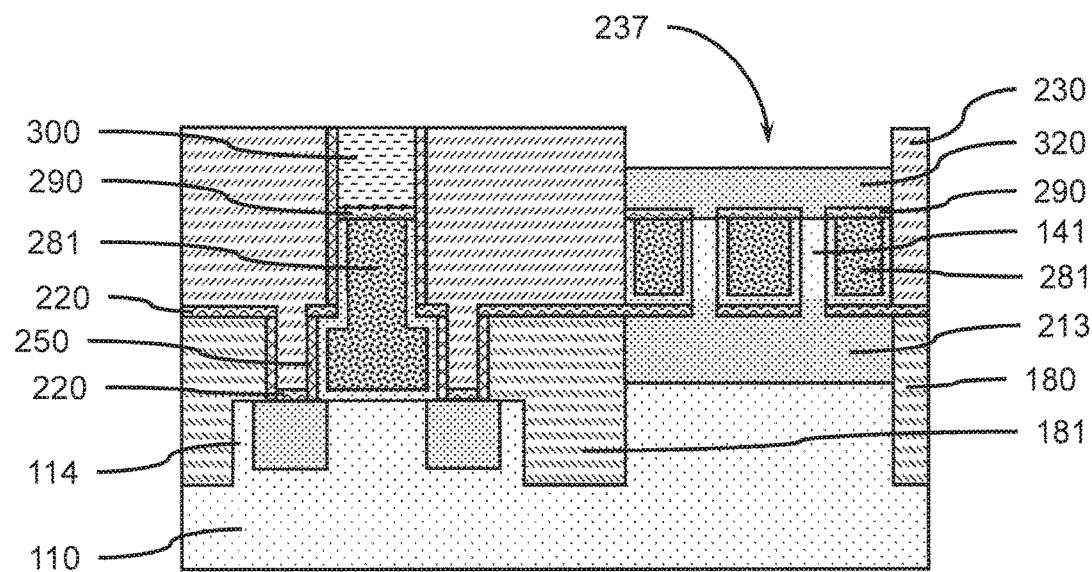
FIG. 37 is a cross-sectional side view showing a top source/drain formed on the top spacer layer and top surfaces of the vertical fins in the source/drain trough, in accordance with an embodiment of the present invention.

FIG. 37 is a cross-sectional side view showing a top source/drain formed on the top spacer layer and top surfaces of the vertical fins in the source/drain trough, in accordance with an embodiment of the present invention.

In one or more embodiments, a top source/drain 320 can be formed on the top spacer layer 290 and top surfaces of the vertical fins 112 in the source/drain trough 237. The top source/drain 320 can be formed by epitaxial growth on single crystal vertical fins 112. In various embodiments, the epitaxial, top source/drains 320 can be formed by vapor phase epitaxy (VPE), ion beam epitaxy (IBE), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing chemical vapor deposition (LRPCVD), molecular beam epitaxy (MBE), liquid-phase epitaxy (LPE), or other suitable processes.

In one or more embodiments, the top source/drains 320 can be suitably doped to form n-type devices (e.g., with phosphorus, arsenic, and/or antimony), or p-type devices (e.g., with boron, gallium, and/or indium). The top source/drains 320 can be doped in situ (i.e., during epitaxial growth), or ex situ (i.e., after growing the layer expitaxially). In various embodiments, the top sources 320 can be formed by any suitable doping techniques, including but not limited to, ion implantation, gas phase doping, plasma doping, plasma immersion ion implantation, cluster doping, infusion doping, liquid phase doping, solid phase doping, etc. In various embodiments, the top source/drains 320 can be highly doped, where the doping can be in the range of about $5\times10^{18}$ to about $1\times10^{22}$, or in the range of about $5\times10^{18}$ to about $3\times10^{21}$, or in the range of about $5\times10^{19}$ to about $1\times10^{21}$, or in the range of about $1\times10^{21}$ to about $1\times10^{22}$ atoms/cm$^3$.

In one or more embodiments, the top source/drains 320 can have a height in the range of about 20 nm to about 60 nm, or in the range of about 30 nm to about 40 nm, although other heights are also contemplated.

In one or more embodiments, the top source/drains 320 can be silicon-germanium (SiGe) with a germanium concentration in the range of about 40 at. % Ge to about 80 at. % Ge, or in the range of about 60 at. % Ge to about 70 at. % Ge, or about 65 at. % Ge (at. %=atomic percent).

Figure 38:
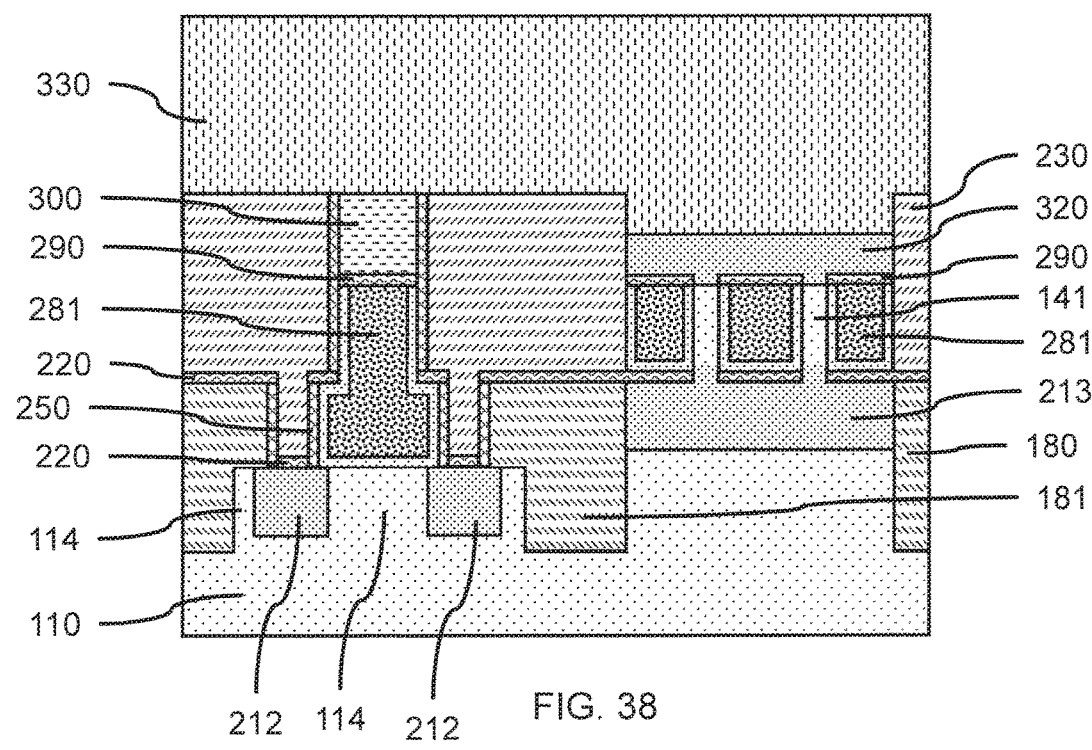
FIG. 38 is a cross-sectional side view showing a capping layer formed on the top source/drain, ILD layer, and planarization layer, in accordance with an embodiment of the present invention.

FIG. 38 is a cross-sectional side view showing a capping layer formed on the top source/drain, ILD layer, and planarization layer, in accordance with an embodiment of the present invention.

In one or more embodiments, a capping layer 330 can be formed on the top source/drain 320, ILD layer 230, and planarization layer 300. In various embodiments, the capping layer can be blanket deposited on the exposed surfaces. The capping layer 330 can be silicon oxide (e.g., SiO$_2$).

Figure 39:
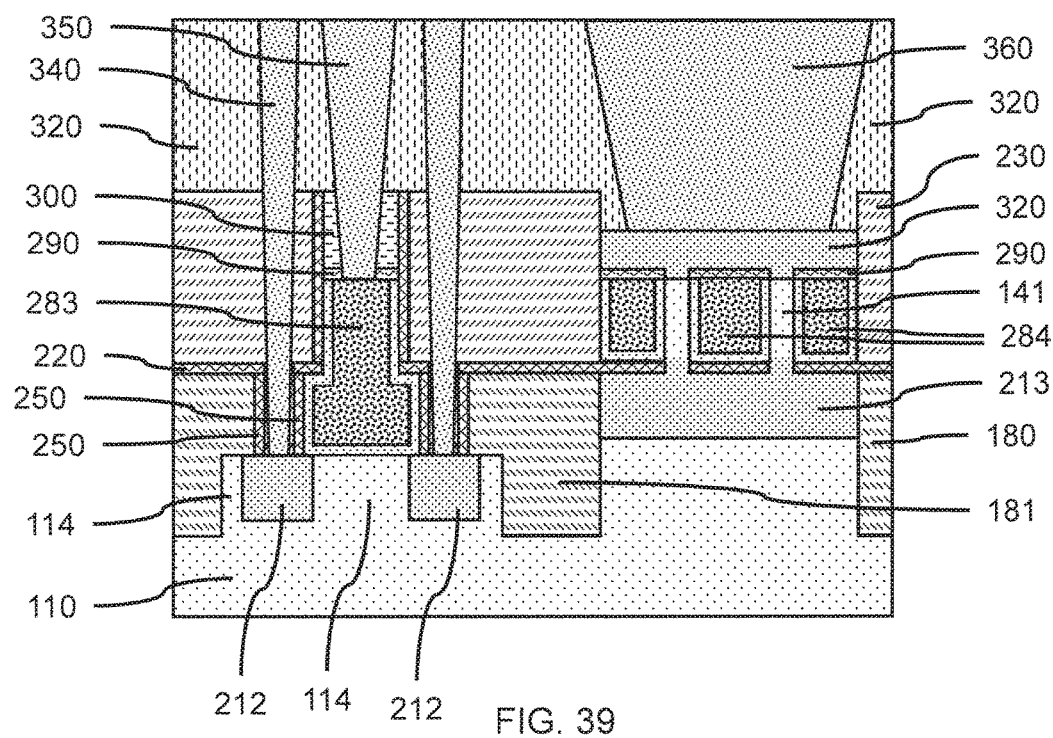
FIG. 39 is a cross-sectional side view showing a vertical transport fin field effect transistor on a first region of the substrate and a neighboring long channel device with gate and source/drain contacts on a second region of the substrate separated by an isolation region, in accordance with an embodiment of the present invention.

FIG. 39 is a cross-sectional side view showing a vertical transport fin field effect transistor on a first region of the substrate and a neighboring long channel device with gate and source/drain contacts on a second region of the substrate separated by an isolation region, in accordance with an embodiment of the present invention.

In one or more embodiments, electrical contacts 340, 350, 360 can be formed to the long-channel source/drains 212, bottom source/drains 213, top source/drains 320, and reduced height gate electrodes 281 of the long-channel gate structure 283 and vertical fin gate structure 284. The gate structure on the long-channel pillar 114 can be an inverted T-shaped gate structure, where the wider portion of the gate structure is directly above the channel region of a long-channel device and between the long-channel source/drains 212. In various embodiments, one or more vertical transport fin field effect transistors can be formed on the fin region 111 of the substrate 110 and one or more long-channel FETs can be formed on the adjacent long-channel region 117 of the substrate. The long-channel pillar 114 can be at a different elevation than the one or more vertical fins 112. The one or more long-channel FETs can be below the vertical transport fin field effect transistors.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertical transport fin field effect transistor and a long-channel field effect transistor on the same substrate, comprising:
    forming a recessed region in a substrate and a fin region adjacent to the recessed region;
    forming one or more vertical fins on the fin region, where the one or more vertical fins extend away from the substrate;
    forming a long-channel pillar from the substrate in the recessed region, where the long-channel pillar is at a different elevation than the one or more vertical fins;
    forming two or more long-channel source/drain plugs on the long-channel pillar;
    forming a bottom source/drain plug in the fin region, where the bottom source/drain plug is below the one or more vertical fins;
    forming a gate structure on the long-channel pillar and a gate structure on the one or more vertical fins; and
    forming a top source/drain on the top surface of the one or more vertical fins, where the top source/drain is in the fin region.

2. The method of claim 1, wherein the one or more vertical fins are formed by a sidewall image transfer (SIT) process, a self-aligned double patterning (SADP) process, or a self-aligned quadruple patterning (SAQP) process.

3. The method of claim 1, wherein the gate structure on the long-channel pillar has an inverted "T" shape directly above a central section of the long-channel pillar.

4. The method of claim 1, wherein the top surface of the long-channel pillar is below the bottom of the one or more vertical fins.

5. The method of claim 1, further comprising forming a segregating trench between the long-channel pillar and fin region, and filling the segregating trench with an insulating dielectric material to provide an isolation region.

6. The method of claim 1, wherein the bottom source/drain plug is epitaxially grown on the fin region adjacent to the one or more vertical fins, and the two or more long-channel source/drain plugs are epitaxially grown on the long-channel pillar.

7. The method of claim 6, further comprising heat treating the bottom source/drain plug and the two or more long-channel source/drain plugs to form a bottom source/drain and two or more long-channel source/drains.

8. The method of claim 7, further comprising forming electrical contacts to the long-channel source/drain, bottom source/drain, top source/drain, long-channel gate structure, and vertical fin gate structure.

9. The method of claim 7, wherein the top source/drain is silicon-germanium (SiGe) with a germanium concentration in the range of about 40 at. % Ge to about 80 at. % Ge, and the bottom source/drain and top source/drain is doped with boron, gallium, or indium.

10. A method of forming a vertical transport fin field effect transistor and a long-channel field effect transistor on the same substrate, comprising:
    forming a recessed region in a substrate and a fin region adjacent to the recessed region;
    forming one or more vertical fins on the fin region, where the one or more vertical fins extend away from the substrate;
    forming a long-channel pillar from the substrate in the recessed region, wherein the top surface of the long-channel pillar is below the bottom of the one or more vertical fins;
    forming a gate structure on the long-channel pillar, wherein the gate structure on the long-channel pillar has an inverted "T" shape directly above a central section of the long-channel pillar; and
    forming a gate structure on the one or more vertical fins.

11. The method of claim 10, wherein the gate structure on the long-channel pillar includes a gate cavity and a gate opening, where the gate cavity is wider than the gate opening to form the inverted "T" shape.

12. The method of claim 10, wherein the substrate can be n-doped or p-doped.

13. The method of claim 10, wherein the long-channel pillar has a height in the range of about 5 nm to about 50 nm, and the top surface of the long-channel pillar is below the bottom of the vertical fins.

14. The method of claim 10, wherein the one or more vertical fins have a height in the range of about 30 nm to about 90 nm.

* * * * *